(12) United States Patent
Costner

(10) Patent No.: US 6,469,901 B1
(45) Date of Patent: Oct. 22, 2002

(54) SYSTEM AND METHOD FOR CARTRIDGE-BASED, GEOMETRY-VARIANT SCALABLE ELECTRONIC SYSTEMS

(75) Inventor: Gary S. Costner, Ojai, CA (US)

(73) Assignee: 3C Interactive, Inc., Oxnard, CA (US)

( * ) Notice: Subject to any disclaimer, the term of this patent is extended or adjusted under 35 U.S.C. 154(b) by 0 days.

(21) Appl. No.: 09/672,678

(22) Filed: Sep. 28, 2000

Related U.S. Application Data

(60) Provisional application No. 60/204,446, filed on May 15, 2000.

(51) Int. Cl.$^7$ ................................................ H05K 7/10
(52) U.S. Cl. .................. 361/730; 361/731; 361/733; 361/735; 439/928.1
(58) Field of Search ............................... 361/689, 686, 361/729–731, 733, 735, 784, 785, 788, 790; 257/685, 686, 723; 439/928, 928.1

(56) References Cited

U.S. PATENT DOCUMENTS

| | | | |
|---|---|---|---|
| 3,495,134 A | * | 2/1970 | Collins et al. ............... 361/735 |
| 4,401,351 A | | 8/1983 | Record |
| 4,423,465 A | | 12/1983 | Teng-Ching et al. |
| 4,499,607 A | * | 2/1985 | Higgins ....................... 361/784 |
| 4,501,460 A | | 2/1985 | Sisler |
| 4,680,674 A | | 7/1987 | Moore |
| 4,937,659 A | * | 6/1990 | Chall, Jr. .................... 257/685 |
| 5,006,961 A | * | 4/1991 | Monico ........................ 361/788 |
| 5,150,279 A | * | 9/1992 | Collins et al. ............... 361/686 |

(List continued on next page.)

OTHER PUBLICATIONS

PCT International Search Report as issued in International Application No. PCT/US01/30846, Mailing Date Jan. 3, 2002.

PCT international Search Report as issued in International Application No. PCT/US01/30833, Mailing Date Dec. 20, 2001.

PCT international Search Report as issued in International Application No. PCT/US01/30844, Mailing Date Jan. 16, 2002.

*Primary Examiner*—David L. Talbott
*Assistant Examiner*—John B. Vigushin
(74) *Attorney, Agent, or Firm*—Foley & Lardner

(57) ABSTRACT

A scalable electronic system is disclosed, comprised of multiple modular electronics clusters. Each modular electronics cluster comprises a receptacle for routing signals, and multiple resource cartridges for performing electronic functions. The resource cartridges are capable of being aligned in close proximity to the receptacle for communicating signals to and from the receptacle. In addition, the resource cartridges aligned with the receptacle are also capable of communicating with each other. The resource cartridges can be aligned or removed from alignment with the receptacle, without the need for additional electrical connection hardware. The receptacle includes at least one vertical transport channel for communicating with other modular electronics clusters. Each modular electronics cluster is capable of being aligned with other modular electronics clusters for communicating signals between the resource cartridges of the aligned modular electronics clusters through the vertical transport channels of the modular electronics clusters. Modular electronics clusters can be aligned or removed from alignment with other modular electronics clusters without the need for additional electrical connection hardware.

26 Claims, 21 Drawing Sheets

U.S. PATENT DOCUMENTS

| | | | |
|---|---|---|---|
| 5,216,579 A | | 6/1993 | Basara et al. |
| 5,227,957 A | | 7/1993 | Deters |
| 5,311,397 A | | 5/1994 | Harshberger et al. |
| 5,331,509 A | * | 7/1994 | Kikinis .................. 361/686 |
| 5,345,779 A | | 9/1994 | Feeney |
| 5,426,738 A | | 6/1995 | Hsieh et al. |
| 5,449,859 A | | 9/1995 | Bordwell |
| 5,467,609 A | | 11/1995 | Feeney |
| 5,472,347 A | * | 12/1995 | Nordenstrom et al. ...... 439/928 |
| 5,499,164 A | * | 3/1996 | Hill-Lindsay et al. ...... 361/785 |
| 5,515,239 A | | 5/1996 | Kamerman et al. |
| 5,568,356 A | * | 10/1996 | Schwartz .................. 361/735 |
| 5,568,361 A | | 10/1996 | Ward et al. .................. 361/735 |
| 5,583,749 A | * | 12/1996 | Tredennick et al. ......... 361/790 |
| 5,586,004 A | | 12/1996 | Green et al. |
| 5,602,721 A | | 2/1997 | Slade et al. |
| 5,604,662 A | | 2/1997 | Anderson et al. |
| 5,608,608 A | | 3/1997 | Flint et al. |
| 5,625,780 A | | 4/1997 | Hsieh et al. |
| 5,676,553 A | * | 10/1997 | Leung .................. 439/928 |
| 5,680,579 A | | 10/1997 | Young et al. |
| 5,691,885 A | | 11/1997 | Ward et al. .................. 361/735 |
| 5,726,922 A | | 3/1998 | Womble et al. |
| 5,737,189 A | | 4/1998 | Kammersgard et al. |
| 5,825,627 A | * | 10/1998 | Tamura .................. 361/735 |
| 5,834,843 A | * | 11/1998 | Mori et al. .................. 257/723 |
| 5,861,873 A | | 1/1999 | Kikinis |
| 5,897,400 A | * | 4/1999 | Amberg et al. ............. 439/928 |
| 5,909,357 A | | 6/1999 | Orr .................. 361/687 |
| 5,941,714 A | * | 8/1999 | Gorbet et al. ............... 439/928 |
| 5,966,292 A | * | 10/1999 | Amberg et al. ............. 361/733 |
| 5,978,821 A | | 11/1999 | Freeny |
| 6,008,530 A | * | 12/1999 | Kano .................. 257/686 |
| 6,027,828 A | * | 2/2000 | Hahn .................. 429/100 |
| 6,147,877 A | * | 11/2000 | Strandberg et al. ......... 361/785 |

* cited by examiner

SYSTEM AND METHOD FOR CARTRIDGE-BASED, GEOMETRY-VARIANT SCALABLE ELECTRONIC SYSTEMS

CROSS-REFERENCE TO RELATED APPLICATIONS

Embodiments of the present invention claim priority from U.S. Provisional Application Serial No. 60/204,446 entitled "Cartridge-Based, Geometry-Variant Scalable Electronics With Synthetic Sentience," filed May 15, 2000, and are related to U.S. utility patent applications entitled "Apparatus and Method for Scalable Electronic Systems Using Cascadable Floor Modules," Ser. No. 09/672,681, filed Sep. 28, 2000; "Apparatus, System, and Method for Hybrid-Geometry Resource Cartridge-Based, Geometry-Variant Scalable Electronic Systems," Ser. No. 09/672,681, filed Sep. 28, 2000; "Apparatus and Method for Scalable Interconnection Networks in Electronic Systems," Ser. No. 09/672,417, filed Sep. 28, 2000; and "Hexagonal Structures for Scalable Electronic Systems," Ser. No. 09/672,538, filed Sep. 28, 2000. The content of these applications are incorporated by reference herein.

BACKGROUND OF THE INVENTION

1. Field of the Invention

The present invention relates, generally, to scalable electronic systems, and, in preferred embodiments, to systems and methods for cartridge-based, geometry-variant, scalable electronic systems.

2. Description of the Related Art

Over the last few years there has been tremendous growth in the awareness of, and the desire to utilize, on-line resources including the Internet and the World Wide Web. New on-line users are jumping in with enthusiasm and high expectations based upon the promises of cyberspace. Business has rushed in as well, with major media companies and publishers, as well as novice entrepreneurs, setting up and championing their own web sites.

The Internet, as a digital resource, is now established in many parts of the world, and is increasingly viewed as an essential utility such as water or electrical power. Furthermore, the global demand for high speed transmission and manipulation of increasingly complex data is unlikely to wane in the foreseeable future. Individuals, corporations, universities, and government agencies like the Pentagon are demanding increased communications speed and computing power to cope with the greater volume of data and the increased complexity of data handling requirements, and will likely purchase as much communication speed and computing power as they can afford because of the substantial revenues or operational efficiencies that accrue when large global demands are satisfied.

However, improvements in the infrastructure needed to support such requirements have not kept pace with the demand. Growth in the hardware market is driven by growing demand for multimedia applications. Demand for multimedia applications is the result of a convergence of expanded processing power, better software programming and the spread of telecommunications computing networks.

Telephone and cable companies face a continuing need to upgrade their switching and distribution networks in response to this high demand. Corporate and institutional local area networks and computing facilities are often overwhelmed by data because of equipment that was not designed to handle the data requirements needed to remain competitive in today's industrial and social climate. For these businesses, and soon the information economy in general, system crashes and slowdowns are likely to increase as current trends continue. The problem reaches far beyond the confines of individual, institutional, corporate, or even national boundaries.

As noted above, the use of, and need for, inexpensive, ubiquitous, and uninterrupted processing power and communications bandwidth is likely to continue into the foreseeable future. As telecommunications networks increase their throughput capacity, becoming more affordable and accessible, the evolutionary progression from stand-alone computers, to network computers, to on-line tele-computing is also likely to accelerate. However, this progression will require new solutions to improve the current infrastructure, which is perilously overburdened at every level.

One methodology that is being developed to increase processing power and bandwidth is parallel computing. Parallel computing uses multiple processors working in parallel on a single computing task. These processors can be linked together within a single computer, or they can be housed separately in a cluster of computers that are linked together in a network. The advantage of parallel computing over traditional, single-processor computing is that it can tackle problems faster and with greater power. For parallel computing to work, however, software and operating systems had to be re-developed within the context of multiple processors working together on one or more tasks. Standards have been developed which ensure that parallel computing users can achieve scalable software performance independent of the machine being used.

As technology has evolved, parallel processing has become a significant segment of the server market, and a growing segment of the desktop PC and workstation market. Sales of workstations and PCs have grown rapidly as the cost of the machines has dropped and their power and functionality have increased. Also fueling this trend has been the proliferation of graphically-oriented, scalable operating systems, such as Sun Microsystems Solaris, Unix, and Linux. Advanced parallelizing resources, such as Portland Group's Fortran and C++ compilers, provide a development environment for porting existing code into parallel scalable software, and for creating new software which maximizes the benefits of distributed processing. The overall effect of these changes has been to deliver increased computing power and flexibility directly to the end user via a desktop computer, while enabling the user to access and process large amounts of data via the cluster or network to which they are connected.

However, conventional network architectures yield communication bandwidths that make highly distributed numerical processing inefficient. Typical parallel programming environments have communications delays of several milliseconds. Fully exploiting the underlying advantages of parallel computing is a challenge that has eluded computer science and applications developers for decades. Developers have had to choose between the tightly coupled architecture and high efficiency of the supercomputer, or the flexibility, scalability, and cost performance of a cluster of PCs.

The execution of computer instructions over multiple processors in supercomputers and massively parallel processors has historically been accomplished by duplicating critical hardware such as memory and input-output (I/O) subsystems. These types of systems offer excellent performance, but are expensive. Moreover, low-volume manufacturing results in a significant cost/performance disadvantage, and engineering lag time may cause a technological gap between products finally appearing on the market and currently available microprocessors.

Networks of servers, workstations, and PCs may offer a cost-effective and scalable alternative to monolithic supercomputers. Using new operating systems and compilers, the bundling together of a cluster of desktop PCs and/or workstations into a parallel system has proven to be an effective solution for meeting the growing demand for computing power. Scalability, the ability to add additional processing nodes to a computing system, may be particularly essential for those systems involved in the delivery of World Wide Web information, due to the fact that Web traffic and the number of users is increasing dramatically. Future Web servers will have to deliver more complex data, voice, and video as subscriber expectations increase. Large scale systems are being built that consist of clusters of low cost computers that communicate with one another through a system area network (SAN). Clusters enable scalability to thousands of nodes, and can exploit the parallelism implicit in serving multiple simultaneous users or in processing large queries involving many storage devices. Thus, clusters can operate as a single system for tasks such as database and on-line transaction processing.

As compared to supercomputers and mainframes, cluster computing systems have the advantages of physical modularity, insulation from obsolescence, physical and logical scalability (expandability), physical and logical upgradability, and improved cost performance. However, cluster computing systems generally have less communication bandwidth, more contingencies and bottlenecks in the network protocol, many redundant and unused components, and a larger physical footprint.

SUMMARY OF THE DISCLOSURE

Therefore, it is an advantage of embodiments of the present invention to provide a system and method for cartridge-based, geometry-variant, scalable electronic systems that have the modularity, flexibility, upgradability, and cost performance of a scaleable cluster array, while yielding the physical compactness, inter-processor communications, and extended computational capabilities of supercomputers, array processors, and mainframes.

It is a further advantage of embodiments of the present invention to provide a system and method for cartridge-based, geometry-variant, scalable electronic systems that can accommodate existing, off-the-shelf standardized parts.

It is a further advantage of embodiments of the present invention to provide a system and method for cartridge-based, geometry-variant, scalable electronics that allows for cartridges comprised of existing, off-the-shelf standardized parts to be upgraded to cartridges comprised of state-of-the-art components.

It is a further advantage of embodiments of the present invention to provide a system and method for cartridge-based, geometry-variant, scalable electronics that is hexagonal shaped to maximize compactness.

It is a further advantage of embodiments of the present invention to provide a system and method for cartridge-based, geometry-variant, scalable electronics that uses heterogeneous processing arrays which simultaneously use a mix of different processor types.

It is a further advantage of embodiments of the present invention to provide a system and method for cartridge-based, geometry-variant, scalable electronics that is compatible with existing software, operating systems, and development tools.

These and other advantages are accomplished according to a scalable electronic system comprised of multiple modular electronics clusters. Each modular electronics cluster comprises a receptacle for routing signals, and multiple resource cartridges for performing electronic functions. The resource cartridges are capable of being aligned in close proximity to the receptacle for communicating signals to and from the receptacle. In addition, the resource cartridges aligned with the receptacle are also capable of communicating with each other. The resource cartridges can be aligned or removed from alignment with the receptacle, without the need for additional electrical connection hardware.

The receptacle includes at least one vertical transport channel for communicating with other modular electronics clusters. Each modular electronics cluster is capable of being aligned with other modular electronics clusters for communicating signals between the resource cartridges of the aligned modular electronics clusters through the vertical transport channels of the modular electronics clusters. Modular electronics clusters can be aligned or removed from alignment with other modular electronics clusters without the need for additional electrical connection hardware.

These and other objects, features, and advantages of embodiments of the invention will be apparent to those skilled in the art from the following detailed description of embodiments of the invention, when read with the drawings and appended claims.

DETAILED DESCRIPTION OF PREFERRED EMBODIMENTS

Figure 1:
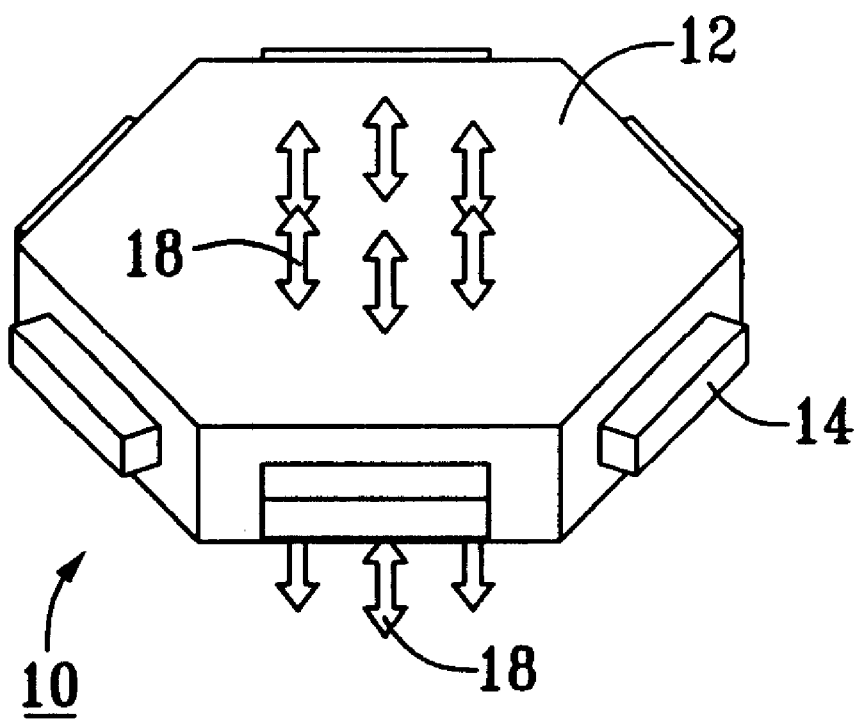
FIG. 1 is a perspective view of a cartridge-based, geometry-variant scalable parallel computer/server (modular electronics cluster) according to an embodiment of the present invention.

In the following description of preferred embodiments, reference is made to the accompanying drawings which form a part hereof, and in which is shown by way of illustration specific embodiments in which the invention may be practiced. It is to be understood that other embodiments may be utilized and structural changes may be made without departing from the scope of the preferred embodiments of the present invention.

The Internet, as a digital resource, is now established in many parts of the world. Individuals, corporations, universities, and government agencies like the Pentagon are demanding increased communications speed and computing power to cope with the greater volume of data and the increased complexity of data handling requirements.

One methodology that is being developed to increase processing power and bandwidth is parallel computing. Parallel computing uses multiple processors working in parallel on a single computing task. These processors can be linked together within a single computer, or they can be housed separately in a cluster of computers that are linked together in a network.

Using new operating systems and compilers, the bundling together of a cluster of desktop PCs and/or workstations into a parallel system has proven to be an effective solution for meeting the growing demand for computing power. Scalability, the ability to add additional processing nodes to a computing system, may be particularly essential for those systems involved in the delivery of World Wide Web information, due to the fact that Web traffic and the number of users is increasing dramatically. Large scale systems are being built that consist of clusters of low cost computers that communicate with one another through a system area network (SAN). Clusters enable scalability to thousands of nodes, and can exploit the parallelism implicit in serving multiple simultaneous users or in processing large queries involving many storage devices.

Embodiments of the present invention relate to systems and methods for volumetrically cascadable geometry-variant electronics. Preferred embodiments of the present invention combine the enhanced communications architecture of a Massively Parallel Processor with the price/performance, flexibility, and standardized programming interfaces of a scalable cluster. Furthermore, embodiments of the present invention are capable of utilizing well known programming interfaces to ensure software portability over a wide range of different systems, and also eliminate the redundant hardware components in a conventional cluster.

It should be noted that although embodiments of the present invention are described herein with respect to a generic parallel computing system, embodiments of the present invention are applicable to a wide variety of general applications that employ scalable electronics of any type and function. More specifically, embodiments of the present invention are applicable to multimedia, telecommunications, digital processing systems, and the like. "Multimedia," as defined herein, includes combinations of data, text, voice, image and video in all forms, including computer generated graphics and effects, film/video/music production, and media on demand. Embodiments of the present invention are also applicable to evolving technologies that include, but are not limited to, WebTV™, Broadband cable services, on-line commerce, and the internet service provider (ISP) business, as well as their enabling technologies.

Furthermore, although embodiments of the present invention are described herein with respect to a generic parallel computing system, embodiments of the present invention are applicable to a wide variety of hardware configurations that include, but are not limited to, desktop personal computers (PCs), network computers, workstations, systems integration computers (servers), and large-scale industrial computers.

Geometry-Variant Scalable Electronics

FIG. 1 illustrates an example of a cartridge-based, geometry-variant scalable parallel computer/server, or more generally a modular electronics cluster 10, according to a preferred embodiment of the present invention. It should be understood that the hexagonal shape of the embodiment of FIG. 1 is merely exemplary, and that other geometries fall within the scope of embodiments of the present invention. In the embodiment of FIG. 1, modular electronics cluster 10 is comprised of a receptacle and one or more resource cartridges 14. In FIG. 1, the receptacle is a chassis 12.

Figure 2:
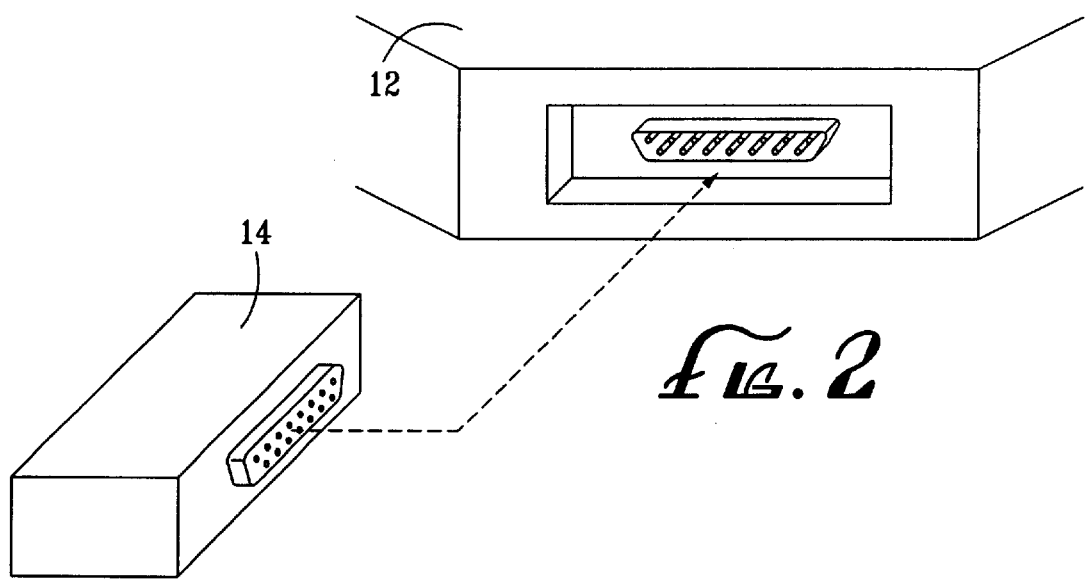
FIG. 2 is a perspective view illustrating a resource cartridge and a chassis of a modular electronics cluster according to an embodiment of the present invention connected through ports or lateral transport channels utilizing conventional blind-mount connector technology.
Figure 3:
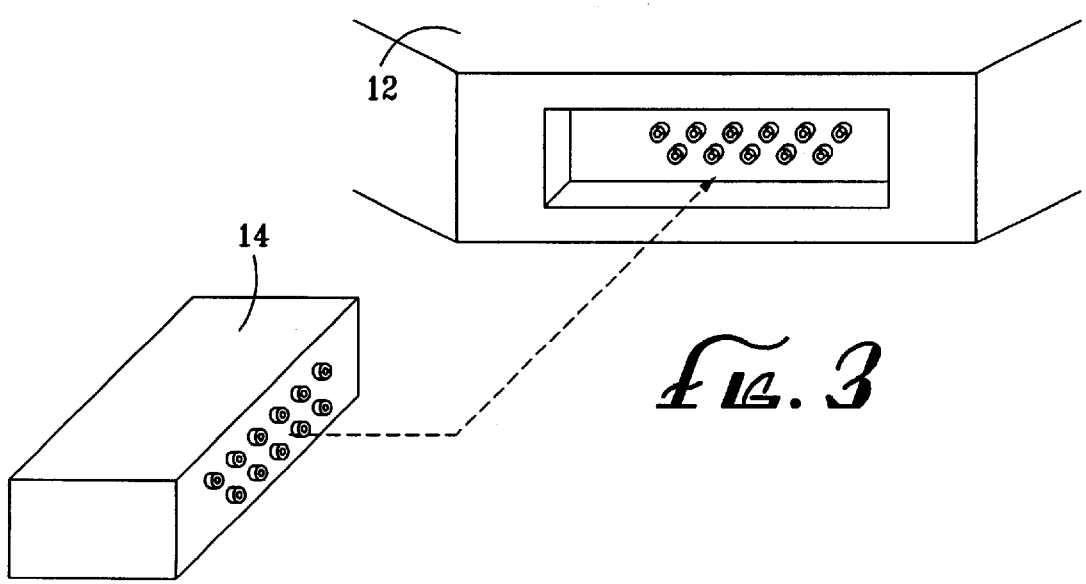
FIG. 3 is a perspective view illustrating a resource cartridge and a chassis of a modular electronics cluster according to an embodiment of the present invention connected through ports or lateral transport channels utilizing wireless communication links that convert between electronic signals and optical signals.

Resource cartridges 14 contain resources (electronic components) which may include, but are not limited to, processors, digital signal processors, programmable logic arrays, memory, tape transport devices, display devices, audio devices, modem connectors, optical couplers, wireless receivers/transmitters, and the like. In the embodiment of FIG. 1, resource cartridges 14 align with and plug into chassis 12 through openings in the faces of chassis 12. Connectivity between resource cartridges 14 and chassis 12 may be effected by ports or lateral transport channels utilizing conventional blind-mount connector technology or the like (see FIG. 2). In addition to utilizing physical hardwire connectors, connectivity may also be achieved through wireless communication links, optical couplers, or laser/optical receiver/transmitter pairs that convert between electronic signals and optical signals (see FIG. 3).

Figure 4:
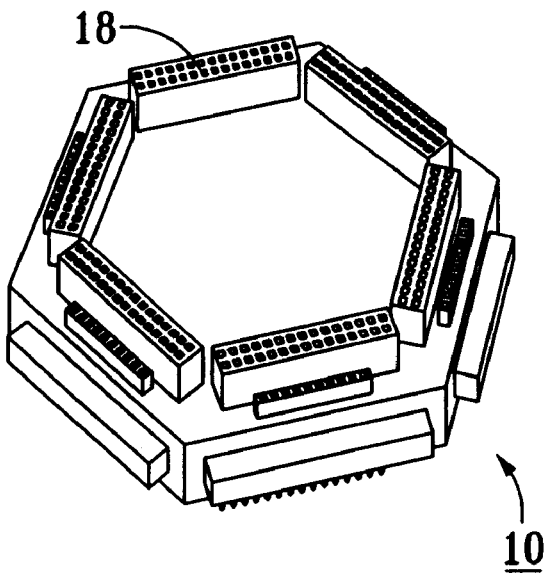
FIG. 4 is a perspective view of upper vertical transport channels in a socket configuration on a cartridge-based modular electronics cluster according to an embodiment of the present invention.
Figure 5:
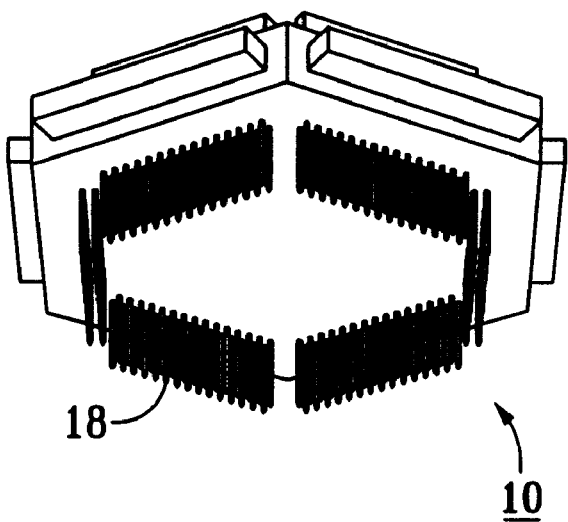
FIG. 5 is a perspective view of lower vertical transport channels in a pin configuration on a cartridge-based modular electronics cluster according to an embodiment of the present invention.

Chassis 12 may also include vertical transport channels 18 (illustrated symbolically in FIG. 1) for making electrical connections with adjacent vertically stacked modular electronics clusters. FIGS. 4 and 5 illustrate one implementation of vertical transport channels 18 using a connector and pin arrangement according to an embodiment of the present invention. Referring again to FIG. 1, chassis 12 may provide power, cooling, or hardware such as passive connectivity (e.g. wires, terminations, and the like) or active connectivity (e.g. amplifiers, line drivers, and the like) for resource cartridges 14, in order to propagate electrical signals throughout chassis 12 and between adjacent clusters to additionally connected chassis, each with additional clusters.

Embodiments of the present invention are scalable in that they include modular electronics clusters designed such that any number of modular electronics clusters may be connected to, and become a working part of, a larger electronic system, without the need for manual installation of additional electrical connection hardware such as connectors, connector adapters, wire bundles, cables, or the like. Preferred embodiments of the present invention are scalable in the vertical dimension and scalable in any horizontal direction. In further preferred embodiments, the resources in the electronic system communicate through a homogeneous topology heterogeneous (variant) protocol that expands as the electronic system expands, without the need to add communication circuitry beyond what is already contained in each modular electronics cluster. Embodiments of the present invention are also geometry-variant in that they are not limited to any particular shape.

Cartridge-based embodiments of the present invention include electronic hardware adapted to be quickly and easily connectable to, and become a working part of, a larger electronic system without requiring access to the interior of the larger electronic system, and without the need for manual installation of additional electrical connection hardware such as connectors, connector adapters, wire bundles, cables, or the like. In preferred embodiments, resource cartridges include a housing, which protects sensitive electronic components from the elements and makes the resource cartridges easier to handle with less chance of damage. Although FIG. 1 illustrates an embodiment where only one resource cartridge 14 fits into each slot of chassis 12, in alternative embodiments a plurality of resource cartridges 14 may fit into each slot of chassis 12.

Figure 6:
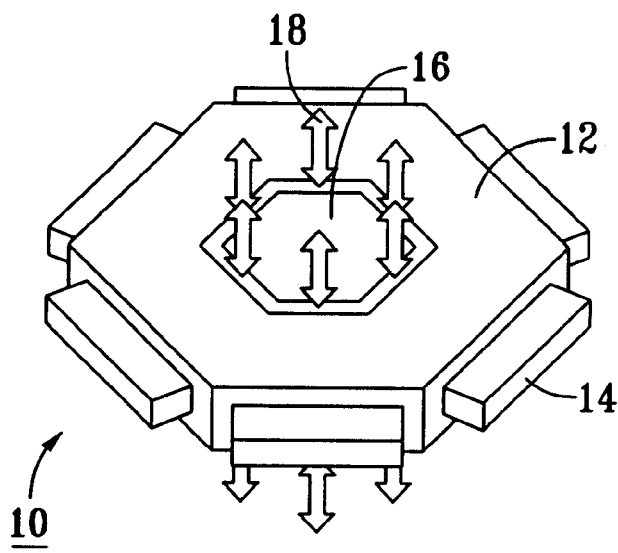
FIG. 6 is a perspective view of a cartridge-based modular electronics cluster that includes a data transport unit insertable into or removable from the chassis according to an embodiment of the present invention.

An alternative embodiment of the present invention is illustrated in FIG. 6, which is similar to the embodiment of FIG. 1, but further includes a centralized data transport unit 16 insertable into or removable from chassis 12. The data transport unit 16 is a passive or active device that routes signals along a particular path, either through hardware such as fixed electrical paths, or through configurable electrical paths. Again, it should be understood that the hexagonal shape of the embodiment of FIG. 6 is merely exemplary, and that other geometries fall within the scope of embodiments of the present invention. In the embodiment of FIG. 6, data transport unit 16 is insertable into chassis 12 through openings in the top, bottom, or sides (cartridge openings) of chassis 12. In a preferred embodiment, data transport unit 16 makes a direct electrical connection with the resource cartridges 14 through lateral transport channels (not shown in FIG. 6) within the interior of the chassis 12 using conventional pin and socket arrangements, phototransistor/laser diode pairs, or the like, and the chassis 12 just serves to retain the data transport unit 16 and resource cartridges 14. In an alternative embodiment, data transport unit 16 makes a direct electrical connection with the chassis 12 through the lateral transport channels (not shown in FIG. 6). Data transport unit 16 may also include bi-directional vertical transport channels 18 on the top and bottom thereof for making electrical connections with adjacent stacked modular electronics clusters.

Figure 7:
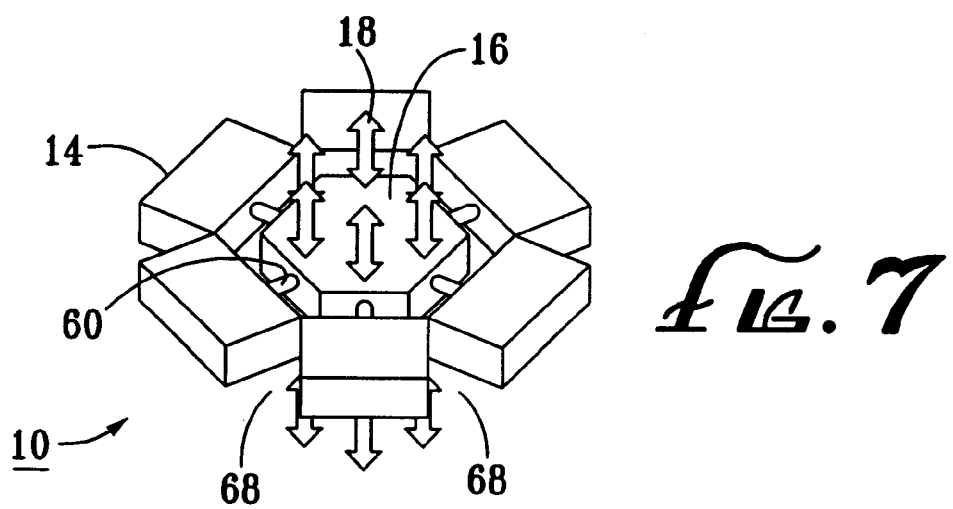
FIG. 7 is a perspective view of a modular electronics cluster that includes resource cartridges insertable into or removable from a data transport unit without a chassis according to an embodiment of the present invention.

Another alternative embodiment of the present invention is illustrated in FIG. 7, which is similar to the embodiment of FIG. 6, except that it does not include a chassis. In FIG. 7, the "receptacle" for the resource cartridges 14 is the data transport unit 16. Again, it should be understood that the hexagonal shape of the embodiment of FIG. 7 is merely exemplary, and that other geometries fall within the scope of embodiments of the present a invention. In the embodiment of FIG. 7, resource cartridges 14 connect directly to data transport unit 16 through lateral transport connectors 60 containing lateral transport channels. Electrical connectivity within lateral transport connectors 60 may be effected by conventional pin and socket arrangements, phototransistor/ laser diode pairs, or the like. Data transport unit 16 may also include bidirectional vertical transport channels 18 for making electrical connections with adjacent (upper and lower) stacked modular electronics clusters.

Figure 8:
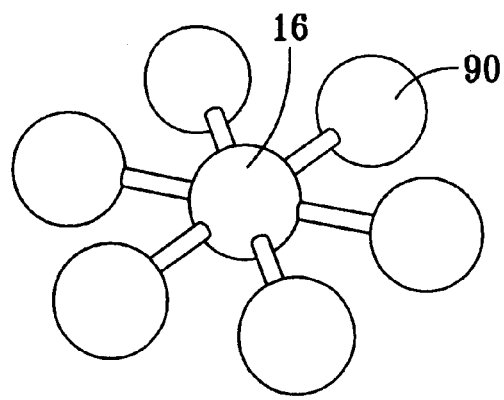
FIG. 8 is a perspective view of a modular electronics cluster comprised of six resources and a data transport unit, symbolically represented as six spheres surrounding and connected to a central sphere according to an embodiment of the present invention.
Figure 9:
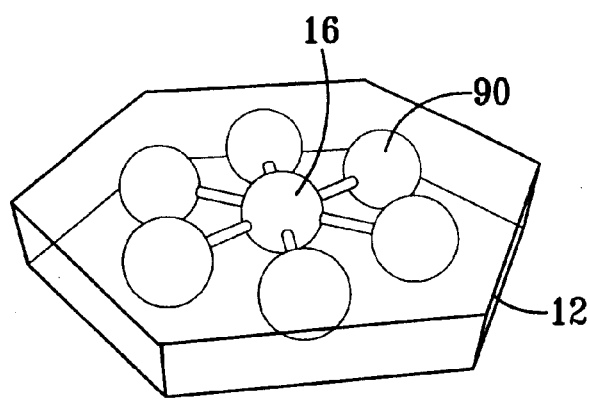
FIG. 9 is a perspective view of a symbolic representation of a modular electronics cluster enclosed in a hexagonal structure according to an embodiment of the present invention.
Figure 10:
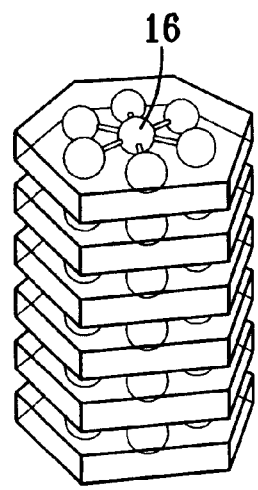
FIG. 10 is a perspective view of a symbolic representation of a stack of six modular electronics clusters connected for greater computing power, wherein each modular electronics cluster is electrically connected to adjacent modular electronics clusters through vertical transport channels in the data transport unit (the central sphere) according to an embodiment of the present invention.
Figure 11:
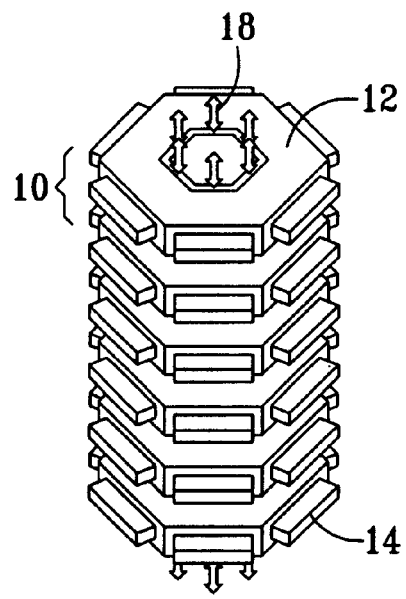
FIG. 11 is a perspective view of a vertical stack of six cartridge-based modular electronics clusters, each modular electronics cluster connected to an adjacent modular electronics cluster through vertical transport channels in a data transport unit according to an embodiment of the present invention.

The vertical cascadability, or scalability, of embodiments of the present invention can be illustrated symbolically in a series of drawings beginning with FIG. 8, which shows a basic six-node modular electronics cluster. In FIG. 8, the six resource cartridges 14 and data transport unit 16 of FIG. 6 are symbolically represented as six spheres surrounding and connected to a central sphere. FIG. 9 shows the same six-node modular electronics cluster contained within a chassis 12, symbolically represented as a hexagonal enclosure. A stack of six modular electronics clusters can be connected through their centralized data transport units 16 for greater computing power, as illustrated in FIG. 10. In FIG. 10, each modular electronics cluster is electrically connected to adjacent modular electronics clusters through vertical transport channels in the data transport unit 16 (the central sphere). FIG. 11 illustrates a vertical stack of six modular electronics clusters 10 of the type illustrated in FIG. 6, each modular electronics cluster 10 connected to an adjacent modular electronics cluster 10 through vertical transport channels 18. It should be understood that the stacking and connection concepts of FIG. 11 are equally applicable to modular electronics clusters 10 of the type illustrated in FIGS. 1 or 7.

Figure 12:
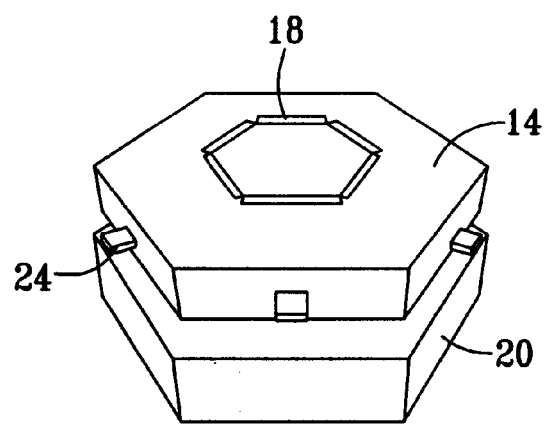
FIG. 12 is a perspective view of a resource cartridge including vertical transport channels which allow multiple resource cartridges to be stacked and electrically connected without need for a chassis or a separate data transport unit according to an embodiment of the present invention.
Figure 13:
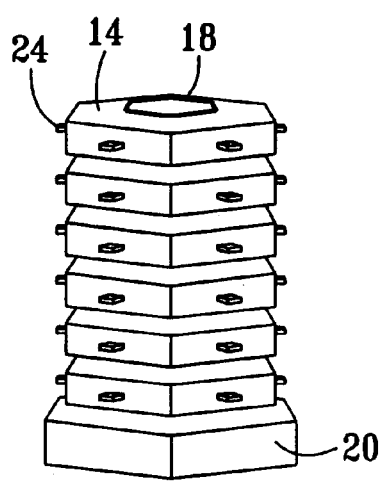
FIG. 13 is a perspective view of a stack of resource cartridges supported by a base module according to an embodiment of the present invention.
Figure 14:
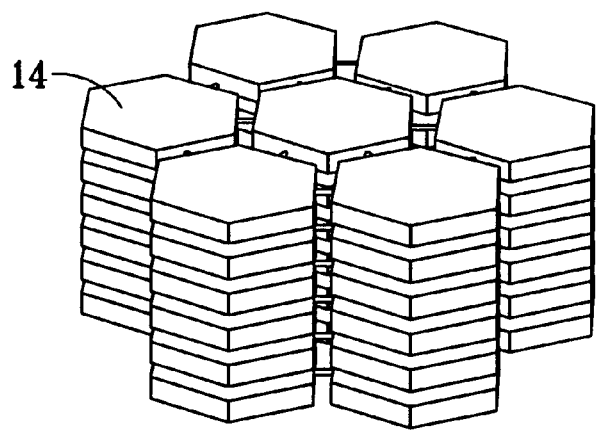
FIG. 14 is a perspective view of a plurality of resource cartridges stacked vertically and connected laterally through lateral transport channels according to an embodiment of the present invention.

Another alternative embodiment of the present invention is illustrated in FIG. 12, wherein the hexagonal unit is not a chassis, but an individual resource cartridge 14. In the embodiment of FIG. 12, each resource cartridge 14 may contain a cluster of resources (not shown in FIG. 12) which are connected to each other internally, and are capable of connecting to other resources in adjacent clusters through vertical transport channels 18 and lateral transport channels 24. The vertical transport channels 18 allow multiple resource cartridges 14 to be stacked and electrically connected without need for a chassis or a separate data transport unit, as illustrated in FIG. 13. Alternatively, a chassis could be added to provide some structural support while maintaining electrical connectivity within. and between the resource cartridges 14. Note that in FIGS. 12 and 13, a base module 20, which may contain power supplies, additional disk drives, and the like, supports and is electrically connected to the plurality of resource cartridges 14. Again, it should be understood that the hexagonal shape of resource cartridge 14 in FIGS. 12 and 13 is merely exemplary, and that other geometries fall within the scope of embodiments of the present invention. The lateral transport channels 24 allow horizontally adjacent resource cartridges 14 to be connected, providing the horizontal or lateral scalability illustrated in FIG. 14. Electrical connectivity between horizontally adjacent resource cartridges 14 may be effected by conventional pin and socket arrangements, phototransistor/ laser diode pairs, or the like.

Figure 15:
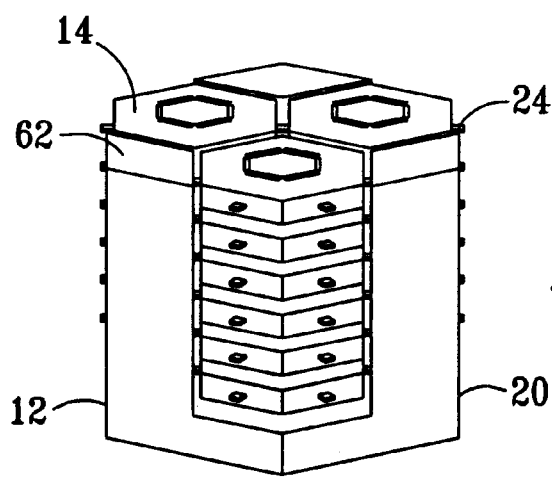
FIG. 15 is a perspective view of three stacks of multiple resource cartridges contained in a chassis which includes a base module and vertical extensions according to an embodiment of the present invention.

FIG. 15 illustrates an example of a further alternative embodiment, wherein three stacks of multiple resource cartridges 14 are contained in a chassis 12. Chassis 12 includes a base module 20 and vertical extensions 62. Resource cartridges 14 are electrically connectable to vertical extensions 62 of chassis 12, and to adjacent resource cartridges 14, through lateral transport channels 24.

As noted briefly in embodiments of the present invention described above, electrical connectivity may be needed between one or more of resources or resource cartridges, chassis, and data transport units. It should be understood that any of the conventional serial or parallel data transmission schemes, which include, but are not limited to wires, terminations, twisted pairs, shielded wires, controlled impedance wiring or lines, fiber optics, line drivers and receivers, photo transistors, and laser diodes fall within the scope of embodiments of the present invention.

Figure 16:
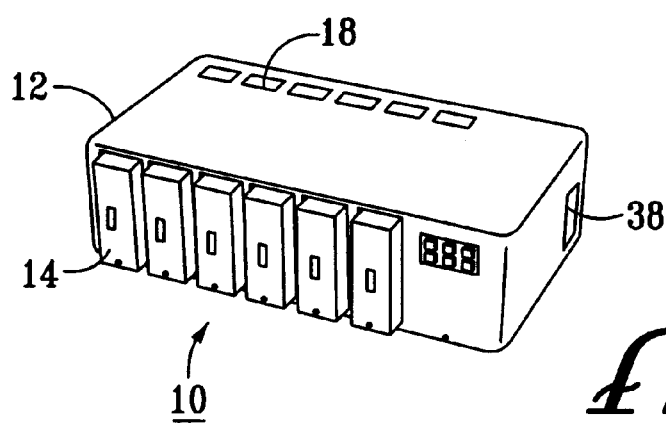
FIG. 16 is a perspective view of a rectangular-shaped modular electronics cluster with resource cartridges plugged into slots in the front of the chassis according to an embodiment of the present invention.

Yet another embodiment of the present invention is illustrated in FIG. 16, wherein chassis 12 of modular electronics cluster 10 is rectangular-shaped, and resource cartridges 14 plug into slots in the front of chassis 12. A data transport unit (not shown in FIG. 16) located within chassis 12 may include vertical transport channels 18 positioned at the top and bottom of chassis 12 to connect with adjacent vertically-stacked modular electronics clusters, and/or horizontal transport channels 38 to connect with adjacent horizontally-aligned modular electronics clusters 10. Lateral transport channels 24 (not shown in FIG. 16) connect the resource cartridges 14 to the data transport unit.

Although the resource cartridges 14 and data transport unit of modular electronics cluster 10 of the embodiments of the present invention illustrated in FIG. 16 may resemble the circuit card and backplane architecture of a conventional personal computer (PC), the embodiment illustrated in FIG. 16 is unlike a PC or other computing device with a similar internal architecture for several reasons. First, conventional PCs typically include a chassis cover that must be removed to insert or remove circuit cards. Second, in a PC-based system there are a limited number of slots, and once the slots are filled, additional computers or racks and wiring must be added to effect an expansion of the system. In contrast, in the embodiment of FIG. 16, any number of resource cartridges 14 can be inserted into any number of stacked or horizontally aligned modular electronics clusters without the need for additional hard wiring. The data transport unit, with its vertical transport channels 18 and horizontal transport channels 38 electrically connectable to adjacent modular electronics clusters, functions as an expandable backplane.

Regardless of how resources are physically scaled, the scalability achievable by embodiments of the present invention may be enabled by connecting all resources through a homogeneous topology heterogeneous (variant) protocol. Unlike simple scalable systems that can interconnect basic elements such as resistors or capacitors using direct point-to-point wiring, embodiments of the present invention may include complex standalone systems within each resource, the interconnection of which requires a centralized switch fabric distributed across all resources in a system. When multiple resources are connected together, the interconnected homogeneous topology heterogeneous (variant) protocol forms an integrated network enabling communication between any resource in the system. Through the centralized switch fabric, all resources in the network are essentially connected together.

Figure 17:
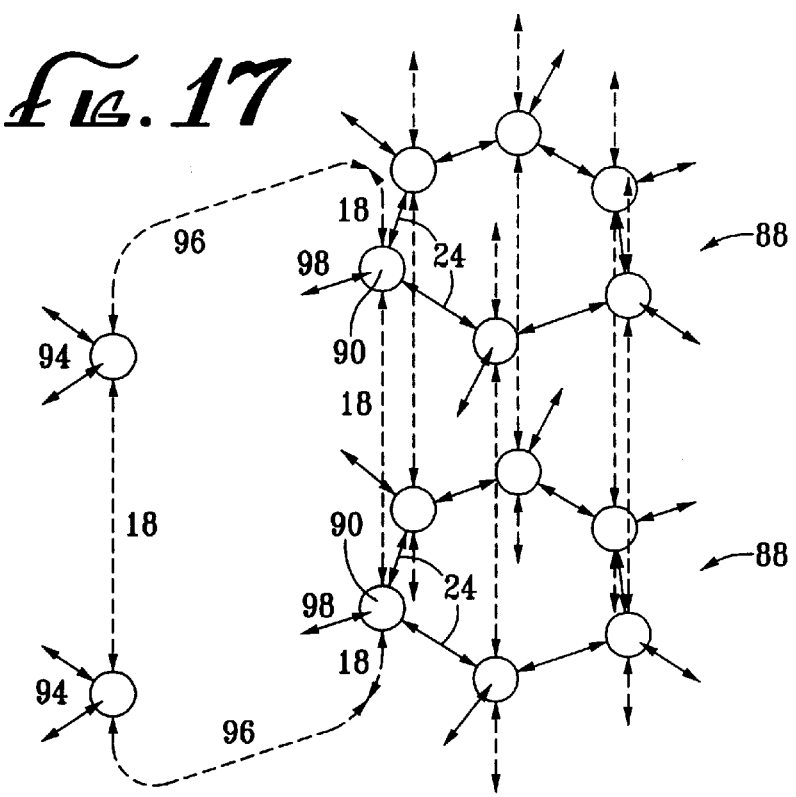
FIG. 17 is a symbolic representation of communication paths that may exist between resources within a cluster, and between resources in adjacent clusters, in embodiments of the present invention.
Figure 18:
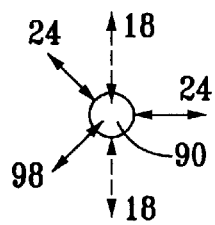
FIG. 18 is a symbolic representation of connectivity paths that may exist for each resource in embodiments of the present invention.
Figure 19:
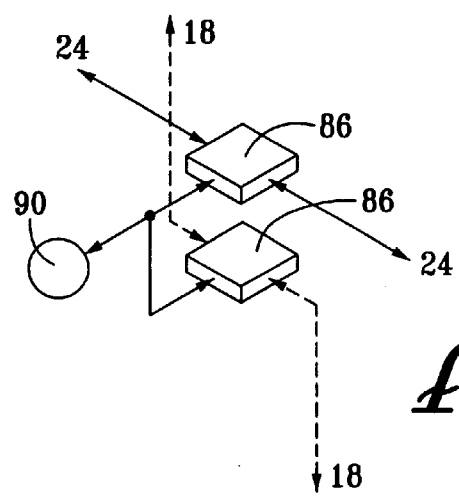
FIG. 19 illustrates how two PSB-64 Bridge Chips may be implemented to provide connectivity for each resource in embodiments of the present invention.

Communication paths between resources within a cluster, and between resources in adjacent clusters, may be implemented as symbolically illustrated in the example of FIG. 17, which shows a stack of two clusters 88 and the connectivity of their resources 90. Vertical transport channels 18 are indicated by dashed lines, while lateral transport channels 24 and 98 are indicated by solid lines. Note that lateral transport channels 24 connect resources 90 within the same clusters, while lateral transport channels 98 connect resources in adjacent vertical stacks. It should be understood, however, that the connectivity symbolized by lateral transport channels 98 can be accomplished by utilizing the topmost and bottommost vertical transport channels 18 and connecting resources 94 in adjacent vertical stacks in a loop indicated by paths 96. FIG. 18 symbolically illustrates some of the connectivity paths that may be required by each resource 90. Bridge circuitry may be employed to provide high-bandwidth, low-latency messaging and transparent input/output (I/O) transfers between the buses of each resource 90. For example, Peripheral Component Interconnect (PCI)-standard compliant and Scalable Coherent Interface (SCI)-standard compliant bridge chips, such as the Dolphin Interconnect Solutions PSB-64 Bridge Chip with 64-bit buses and remote memory access (RMA), may be used to provide an SCI-compliant link for each resource cartridge 14. FIG. 19 symbolically illustrates how two PSB-64 Bridge Chips 86 can be implemented to provide connectivity for a resource 90. Lateral transport channel 98 does not appear in FIG. 19 because, as indicated above with reference to FIG. 17, the connectivity of lateral transport channel 98 can be accomplished using vertical transport channels 18. Thus, the use of two Dolphin PSB-64 Bridge Chips for each of the resource cartridges 14 in FIG. 17 allows any resource to communicate with any other resource through a scalable, single-protocol integrated homogeneous communication network.

Figure 20:
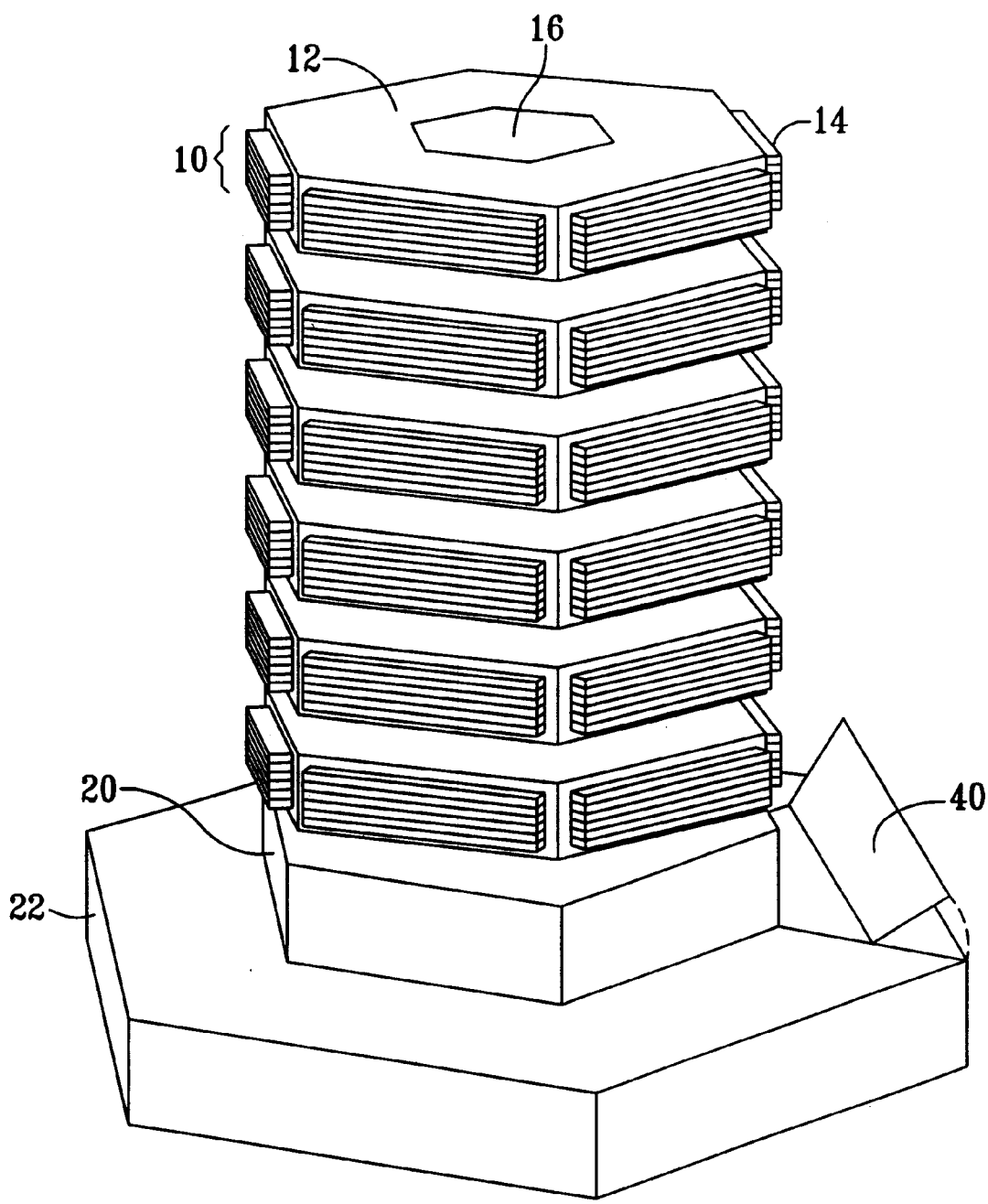
FIG. 20 is a perspective view of six hexagonal modular electronics clusters in a vertical stack and supported by a base module and a floor module according to an embodiment of the present invention.

A perspective view of a preferred embodiment of the invention is shown in FIG. 20. FIG. 20 illustrates six hexagonal modular electronics clusters 10 in a vertical stack, each modular electronics cluster 10 coupled to adjacent modular electronics clusters 10 through its data transport unit 16. Within each modular electronics cluster 10 is a chassis 12 which holds a plurality of resource cartridges 14 in each hexagonal face of chassis 12. The arrangement is vertically scalable so that it can accommodate additional modular electronics clusters 10 simply by stacking them. In preferred embodiments, underneath the vertical stack is a base module 20 which is electrically connected to the vertical stack, and may contain power supplies, additional disk drives, and the like. In further preferred embodiments, below base module 20 is a floor module 22, which may also be electrically connected to the base module 20 and contain additional electronics and hardware for connecting to adjacent floor modules.

Figure 21:
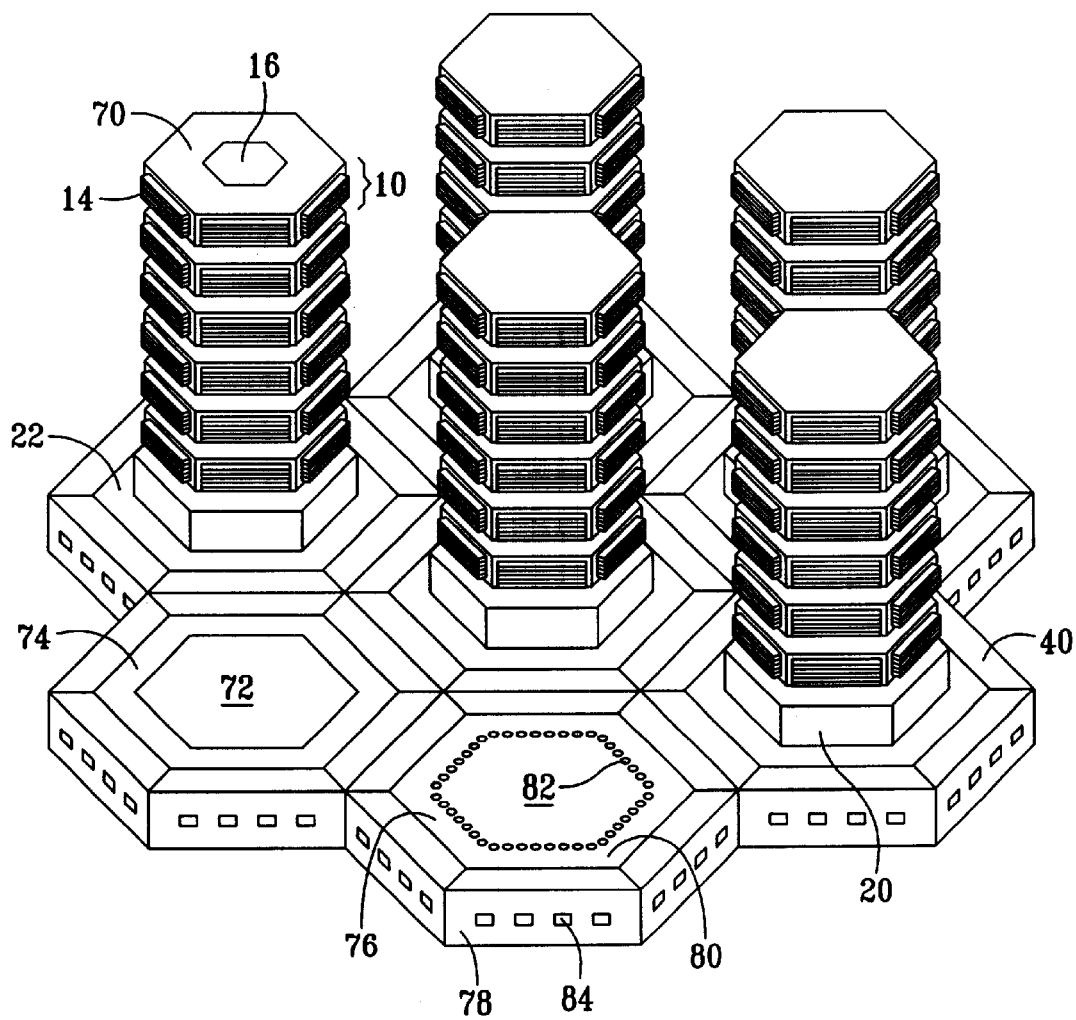
FIG. 21 is a perspective view of a plurality of vertical stacks of modular electronics clusters, each vertical stack connected to other vertical stacks through floor modules according to an embodiment of the present invention.

FIG. 21 illustrates a plurality of vertical stacks 70 of modular electronics clusters 10, each vertical stack connected to other vertical stacks through floor modules 22. In preferred embodiments, each resource cartridge 14 in FIG. 21 is capable of communicating with every other resource cartridge 14. First, resource cartridges 14 in each cluster 10 are electrically connected to each other by the data transport unit 16 within that cluster. Second, each data transport unit 16 electrically connects any given resource cartridge 14 in any given cluster to any other resource cartridges 14 in any other cluster in the same vertical stack 70. Finally, any given resource cartridge 14 in any given vertical stack is electrically connectable to any other resource cartridges 14 in any other vertical stack 70 through electrical connectivity provided in the data transport units, base modules 20, and floor modules 22.

Figure 22:
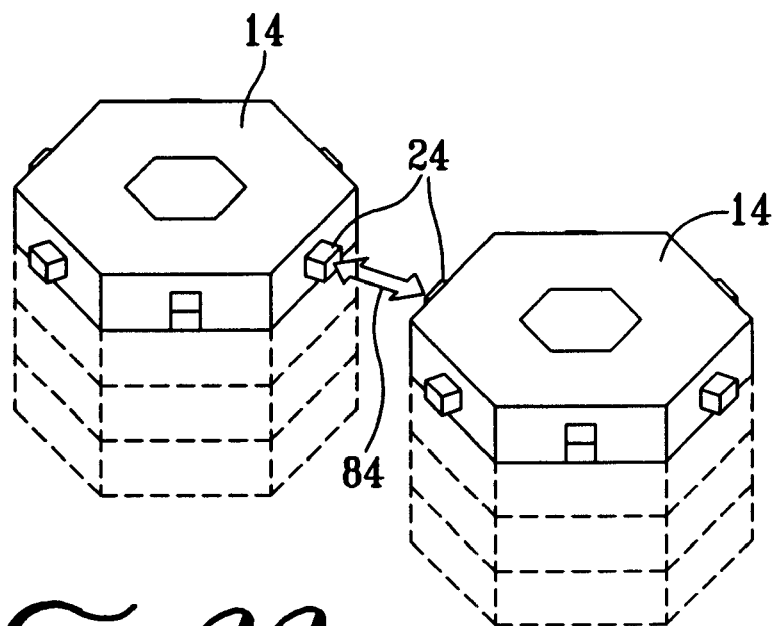
FIG. 22 illustrates how a vertical stack of resource cartridges can be laterally scaled by placing other vertical stacks of resource cartridges in close proximity and connecting the lateral transport channels of adjacent resource cartridges according to an embodiment of the present invention.
Figure 23:
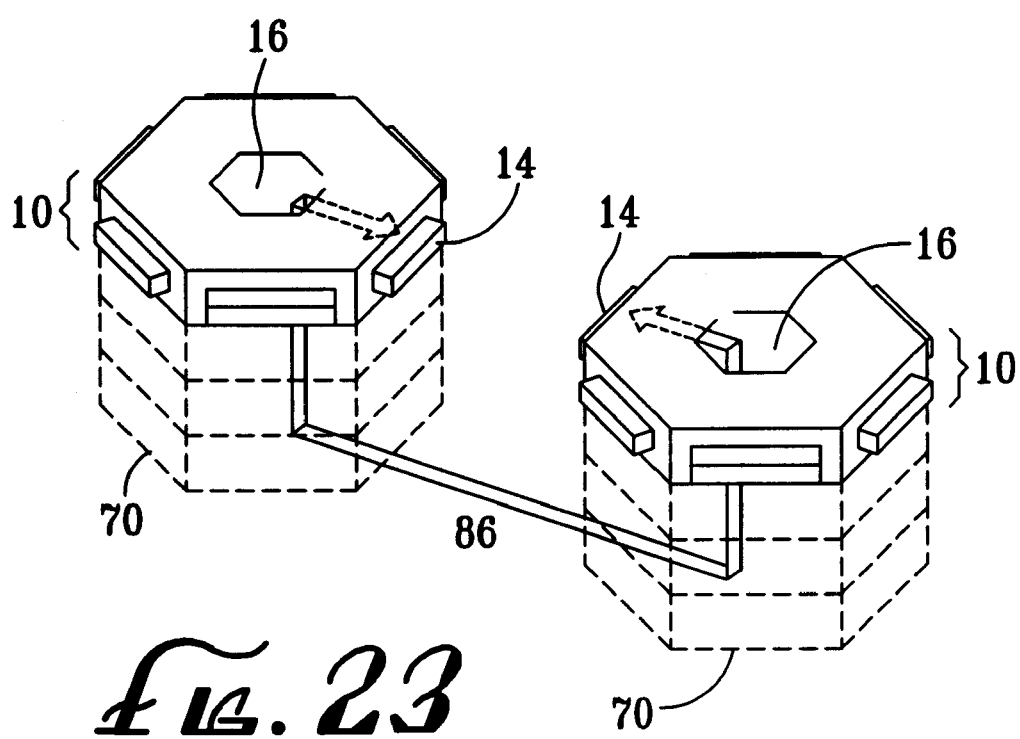
FIG. 23 illustrates how a vertical stack of cartridge-based modular electronics clusters is laterally scalable to modular electronics clusters in other vertical stacks through lateral transport channels that connect adjacent resource cartridges through the data transport unit, base modules, and floor modules according to an embodiment of the present invention.

A comparison of horizontal or lateral scalability between various embodiments of the present invention may be made with reference to FIGS. 22 and 23. In FIG. 22, a vertical stack of resource cartridges 14 (see the embodiment of FIG. 12) is laterally scalable by placing other vertical stacks of resource cartridges in close proximity and connecting the lateral transport channels 24 of adjacent resource cartridges, as indicated by arrow 84 (see FIG. 14). In contrast, in FIG. 23, a vertical stack 70 of modular electronics clusters 10 (see the embodiment of FIG. 6), including resource cartridges 14, is laterally scalable to modular electronics clusters 10 in other vertical stacks 70 through lateral transport channels that connect adjacent resource cartridges 14 through the data transport unit 16, base modules (not shown in FIG. 23), and floor modules (not shown in FIG. 23), as indicated by arrow 86 (see FIG. 21). In this manner, lateral scalability is achieved even though the vertical stacks may be physically separated.

Figure 24:
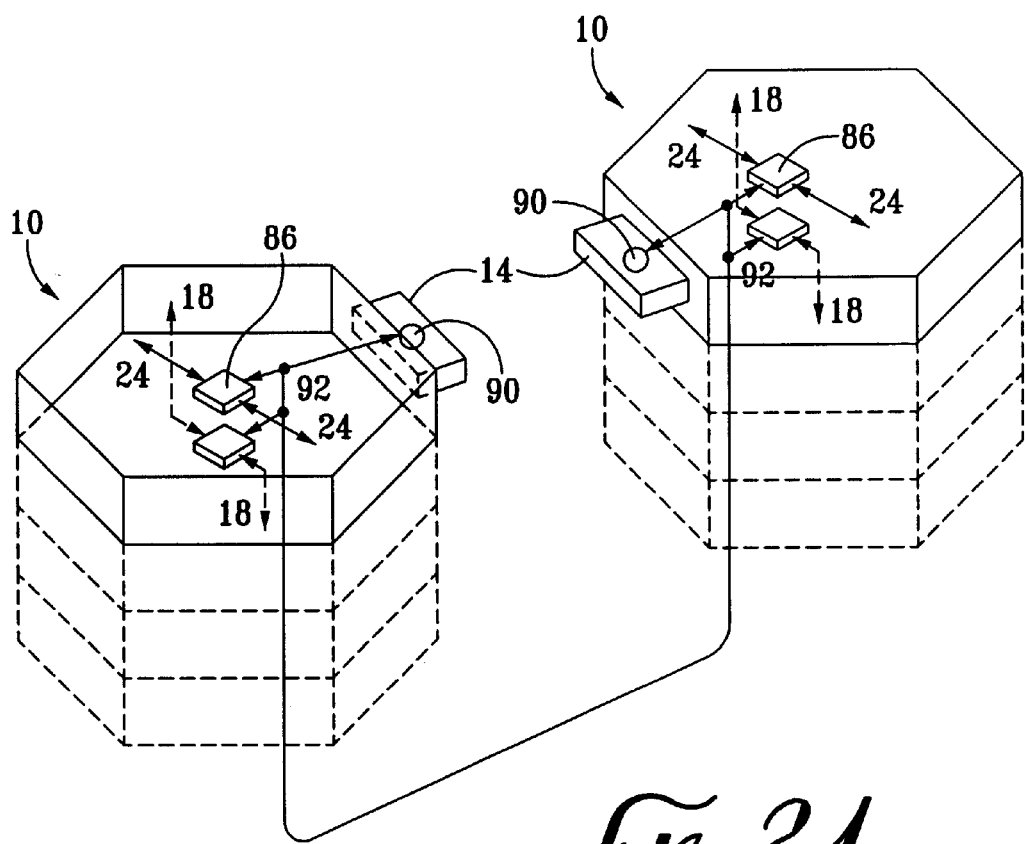
FIG. 24 illustrates both the vertical and horizontal scalability of resources according to embodiments of the present invention.

FIG. 24 illustrates both the vertical and horizontal scalability of resources according to embodiments of the present invention. In FIG. 24, a resource cartridge 14 containing a resource 90 forms part of a cluster 10, which is part of a vertical stack 70. It should be noted, however, that resource 90 need not be contained in a cartridge 90, and in alternative embodiments may permanently reside within cluster 10. Resource 90 communicates with bridge chips 86, where signals can be propagated through lateral transport channels 24 to other bridge chips for communicating with other resources within the same cluster 10, or propagated through vertical transport channels 18 to other bridge chips for communicating with other resources within vertically adjacent clusters, enabling vertical scalability. Furthermore, signals can be propagated through lateral transport channels 92 to other bridge chips for communicating with other resources within other stacks, enabling horizontal scalability.

In preferred embodiments of the present invention, although the geometry of the modular electronics cluster is not limited to any particular configuration, each modular electronics cluster in a particular system will be "regular," or the same geometry. Regular geometry-variant modular electronics clusters enable lateral or horizontal scalability in any direction. Thus, as is evident from FIGS. 14 or 21, in preferred embodiments hexagonal resource cartridges 14 (FIG. 14) or modular electronics clusters 10 (FIG. 21) allow for scalability in any horizontal direction.

Figure 25:
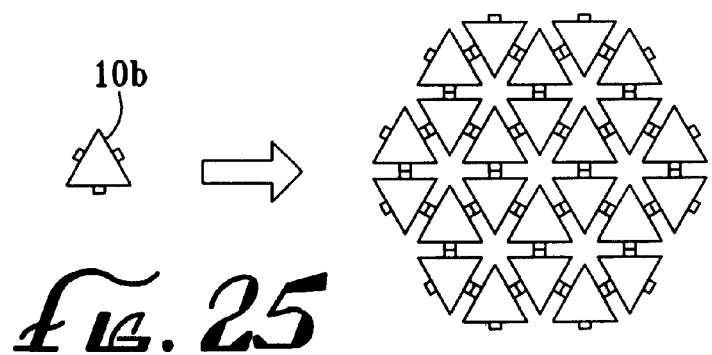
FIG. 25 is a top view illustrating the lateral scalability of a triangular modular electronics cluster according to an embodiment of the present invention.
Figure 26:
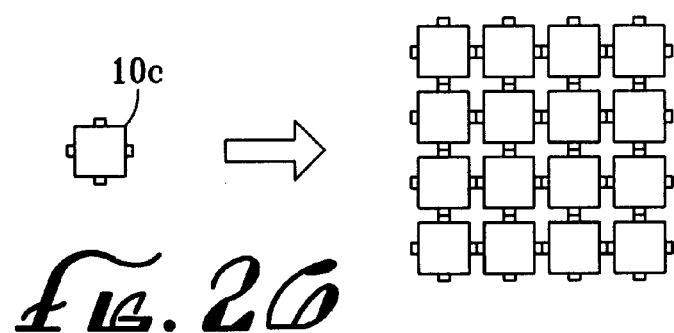
FIG. 26 is a top view illustrating the lateral scalability of a square modular electronics cluster according to an embodiment of the present invention.
Figure 27:
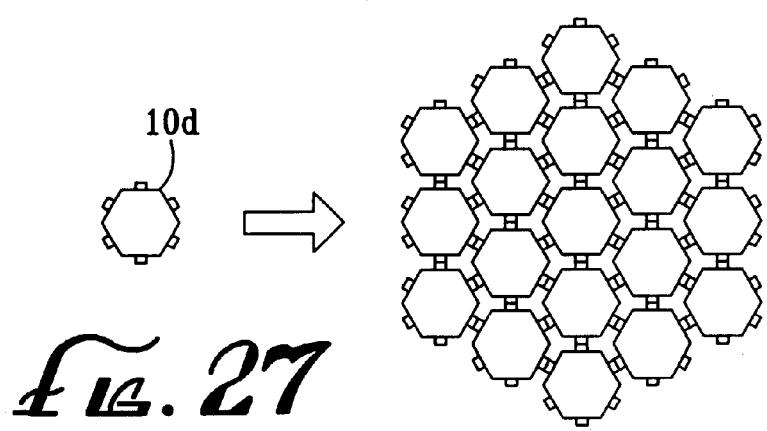
FIG. 27 is a top view illustrating the lateral scalability of a hexagonal modular electronics cluster according to an embodiment of the present invention.
Figure 28:
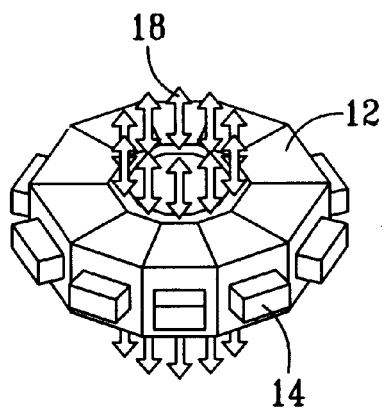
FIG. 28 is a perspective view of a multi-sided cartridge-based modular electronics cluster whose shape approaches that of a circle according to an embodiment of the present invention.

However, in alternative embodiments of the present invention, scalability in multiple horizontal directions is possible using other regular geometries having lateral transport channels on all sides. For example, FIG. 25 is a top-view symbolic illustration of a triangular cluster 10b that is scalable in all lateral directions. Triangular cluster 10b may represent a resource cartridge (see reference character 14 in FIG. 12) containing a cluster of resources, in which case the connections between adjacent triangular clusters 10b in FIG. 25 represent direct connections (see FIG. 22). Alternatively, cluster 10b may represent a modular electronics cluster having three resource cartridges, in which case the connections between adjacent triangular clusters 10b in FIG. 25 represent connections "through the floor" (see FIG. 23). Similarly, FIG. 26 is a top-view symbolic illustration of a square cluster 10c that is scalable in all lateral directions, and FIG. 27 is a top-view symbolic illustration of a hexagonal cluster 10d that is scalable in all lateral directions. Although some shapes (such as a pentagonal shape) do not yield optimal compactness when laterally scaled, any multi-sided modular electronics cluster 10 that accommodates multiple resource cartridges falls within the scope of embodiments of the present invention. It should be understood that as the number of sides increases, the shape of the modular electronics cluster approaches and includes a circle, as illustrated in FIG. 28.

The scalability inherent in embodiments of the present invention results in more than increased processing power. Scalability also provides insulation from obsolescence, because resource cartridges can be swapped out and systems with increased processing capabilities can be created by using next-generation resource cartridges. Furthermore, the scalability of modular electronics clusters 10 enables maximum processing power in a minimal space. For example, a conventional parallel computing system with the processing power of the system of FIG. 21 may take up several rooms with associated space penalties, cooling requirements, and maintenance overhead. In addition, such a conventional parallel computing system may include a significant amount of redundant components such as keyboards, keyboard controllers, video circuits, and the like, which may consume expensive "real estate" on the motherboard.

However, because embodiments of the present invention allow for special-purpose resource cartridges to be plugged in on an as-needed basis, much of the hardware in a typical desktop computer that would be unnecessary in a parallel computing system can be eliminated. As these unnecessary components represent a significant portion of the cost of a PC, the performance per dollar ratio and the performance per volume ratio can be improved. In addition, improvements in compactness provide a secondary benefit of cost savings in overhead and maintenance.

In cascaded computing systems formed from modular electronics clusters 10, a resource task manager may be used to control parallel processing. This resource task manager can be centralized in one server located within the resource cartridges, or it could be distributed among many servers. Distributed run-time diagnostics may be continually performed in the form of pinging or other communications between the resource task manager and the other distributed processors, to determine what processors are available over the system. Thus, in one embodiment of the present invention a diagnostic link port may be added to every resource cartridge connector to communicate to the resource task manager that a new processor has been added to the system, or that an existing processor has now failed.

Note that although the above description and figures of cartridge-based geometry-variant scalable electronics covered modular electronics clusters with identical-geometry cartridges, it should be understood that cartridges of different sizes may be employed within a single chassis by having different sized openings. Alternatively, fractional-height cartridges may be designed to be received into full-height chassis openings.

Cascadable Floor Modules for Scalable Electronics

As described above, FIG. 20 illustrates six hexagonal modular electronics clusters 10 in a vertical stack. The arrangement is vertically scalable so that it can hold additional modular electronics clusters 10 simply by stacking them. Underneath the vertical stack is a base module 20, which electrically connects the vertical stack to a floor module 22. Floor module 22 may contain additional electronics and hardware for connecting to adjacent floor modules 22. As illustrated in FIG. 21, in preferred embodiments of the present invention floor module 22 includes a top surface 76 supported by support structure 78. An interior volume 80 is defined below top surface 76.

In preferred embodiments, vertical transport channels 82 are located on top surface 76, and provide connectivity through base module 20 to the vertical stack of modular electronics clusters. In addition, lateral transport channels 84 located on one or more sides of the floor module 22 connect to vertical transport channels 82 and provide connectivity between floor modules 22.

When abutted against other floor modules 22 (see FIG. 21), the floor modules 22 create floor space and a physical separation between adjacent vertical stacks 70 of modular electronics clusters, enabling easier access to the vertical stacks of modular electronics clusters. Access to lateral transport channels and other hardware for connecting adjacent floor modules 22 may be provided through access panels 40 (see FIG. 20) in the top surface of floor module 22. Thus, after floor modules 22 are aligned in close proximity to each other, connections between the lateral transport channels of adjacent floor modules 22 may be completed by opening adjacent access panels 40 and physically making the required connections. In other embodiments, the connections are made automatically as the floor modules 22 are aligned in close proximity. In the embodiment of FIGS. 20 and 21, floor module 22 is hexagonally shaped. However, it should be understood that in alternative embodiments, floor module 22 may include any multiple-sided shape. Furthermore, it should be understood that any scalable electronics system may be supported on floor modules 22 and scaled by laterally arranging the floor modules 22 as illustrated in FIG. 21.

In alternative embodiments of the present invention, the floor modules are designed to accept either a base module 20 or a flush-mount cover 72 (see FIG. 21). With the base module 20 installed, a vertical stack 70 of modular electronics clusters can be added. With the flush-mount cover 72 installed, the vertical transport channels 82 are covered and protected, and the floor module 22 may be used as a "blank" or placeholder module (see reference character 74) to create additional space between vertical stacks 70 of modular electronics clusters, while still providing interconnectivity for other vertical stacks 70 of modular electronics clusters.

Hybrid-Geometry Resource Cartridge

As noted above, FIG. 7 illustrates an example of a modular electronics cluster 10 in which resource cartridges 14 connect directly to data transport unit 16. Electrical connectivity between data transport unit 16 and resource cartridges 14 may be effected by conventional pin and socket arrangements, phototransistor/laser diode pairs, or the like. (See connectivity illustrated in FIGS. 2 and 3.) Data transport unit 16 may also include vertical transport channels 18 for making electrical connections with adjacent stacked modular electronics clusters 10.

Fundamentally, the embodiment illustrated in FIG. 7 represents the conversion of one shape (rectangular resource cartridges 14) into another shape (the hexagonal arrangement of rectangular resource cartridges 14). The rectangular shape of resource cartridges 14 may be dictated by the shape of circuit boards, integrated circuits, or the like contained within resource cartridge 14. It would be desirable to orient these rectangular resource cartridges 14 into a hexagonal shape to take advantage of the compactness and efficiency in scaling that are afforded by hexagonal shapes. However, the empty spaces 68 shown in FIG. 7 demonstrate that the rectangular shapes of resource cartridges 14 do not allow for a fully compact modular electronics cluster 10.

Figure 29:
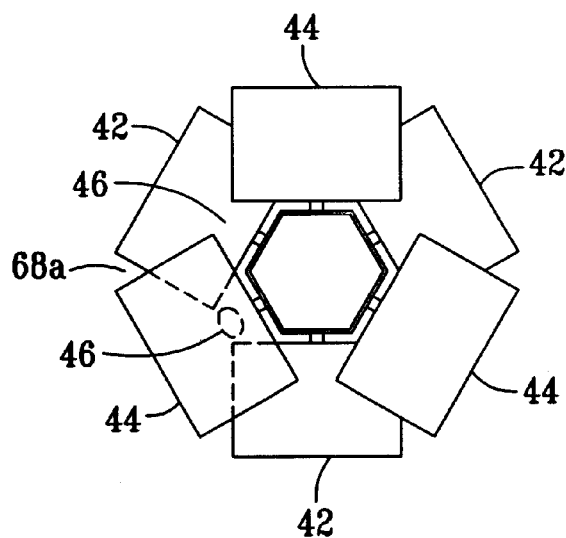
FIG. 29 is a top view of six resource cartridges coupled to a data transport unit and arranged in an overlapping manner to improve compactness in the horizontal dimension while maintaining the rectangular shape of the resource cartridges.

To improve compactness and minimize empty spaces 68 (FIG. 7) in the horizontal dimension while maintaining the rectangular shape of the resource cartridges, resource cartridges may be overlapped by placing alternating resource cartridges in two different planes, as illustrated in the top view of FIG. 29. In FIG. 29, lower resource cartridges 42 lie in a lower plane, while upper resource cartridges 44 lie in an upper plane. However, although the arrangement of FIG. 29 produces a narrower gap 68a, gaps 46 are present between upper resource cartridges 44, and between lower resource cartridges 42. In addition, the arrangement increases the overall vertical size of the cluster 10.

Figure 30:
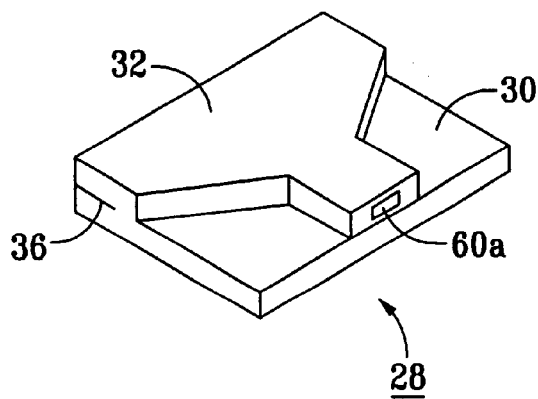
FIG. 30 is a perspective view of a hybrid-geometry resource cartridge according to an embodiment of the present invention.
Figure 31:
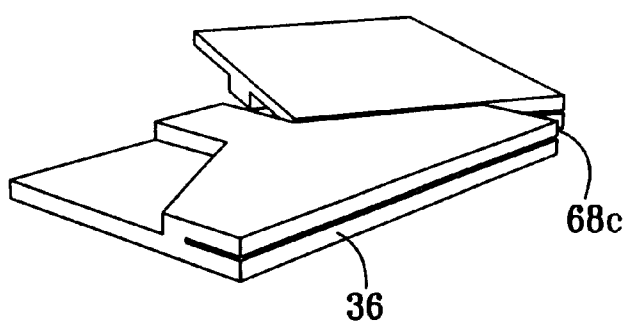
FIG. 31 is a perspective view of two hybrid-geometry resource cartridges arranged in an alternating orientation to improve compactness according to an embodiment of the present invention.

FIG. 30 illustrates a preferred hybrid-geometry resource cartridge embodiment 28 that minimizes both empty spaces and gaps. Hybrid-geometry resource cartridge 28 maintains the rectangular shape that may be required by existing, off-the-shelf components, as indicated by the portion of the cartridge identified by reference character 30, and adds a multisided extension 32. This multi-sided extension 32 fills in the gaps 46 left by the arrangement of FIG. 29, and allows for additional components to be placed within hybrid-geometry resource cartridge 28. Furthermore, by alternating the orientation of adjacent hybrid-geometry resource cartridges 28 as illustrated in FIG. 31, improved compactness can be achieved with minimal empty space 68c.

In the embodiment of FIG. 30, hybrid-geometry resource cartridge 28 may comprise a unitary housing, or separate couplable housings 30 and 32. Furthermore, in alternative embodiments one or more slots 36 shown on the outward facing edge of hybrid-geometry cartridges may be employed to take advantage of the additional cooling that results from the additional surface area created by slots 36.

Figure 32:
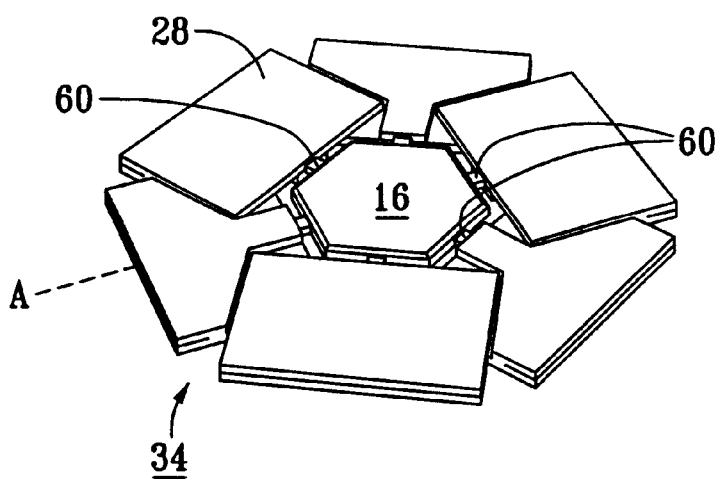
FIG. 32 is a perspective view of six hybrid-geometry resource cartridges arranged in an alternating orientation and connected to a data transport unit to form a single hybrid-geometry resource cartridge-based modular electronics cluster according to an embodiment of the present invention.
Figure 33:
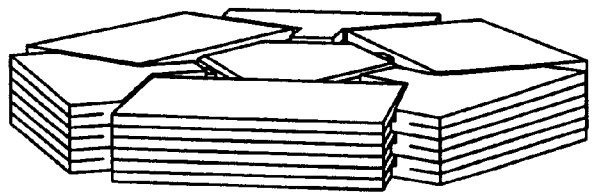
FIG. 33 is a perspective view of a stack of multiple hybrid-geometry resource cartridge-based modular electronics clusters according to an embodiment of the present invention.

FIG. 32 illustrates six hybrid-geometry resource cartridges 28 connected to a data transport unit 16 to form a single hybrid-geometry resource cartridge-based modular electronics cluster 34 according to a preferred embodiment of the present invention. It should be noted that each hybrid-geometry resource cartridge 28 is a single design, arranged in alternating orientations (i.e., flipped 180 degrees about axis A shown in FIG. 32). Furthermore, the hybrid-geometry resource cartridges 28 are arranged in a single plane, so that multiple hybrid-geometry resource cartridge-based modular electronics clusters 34 can be stacked and connected through their data transport units 16 as illustrated in FIG. 33.

While the preferred embodiment of FIG. 30 is useful for adapting rectangular shaped resource cartridges to hexagonal modular electronics clusters, in alternative embodiments a variety of other hybrid geometries may be employed. In general, an adapter geometry (the multi-sided extension 32 in the example of FIG. 30) is used to convert a source geometry (the rectangular shape 30 in the example of FIG. 30), to a target geometry (the hexagonal shape of hybrid-geometry resource cartridge-based modular electronics cluster 34 in FIG. 32). In alternative embodiments of the present invention, as the source and target geometries vary, the adapter geometry will vary. Thus, embodiments of the present invention include resource cartridges of any shape that may be arranged in alternating orientations to form a more compact shape.

Figure 34:
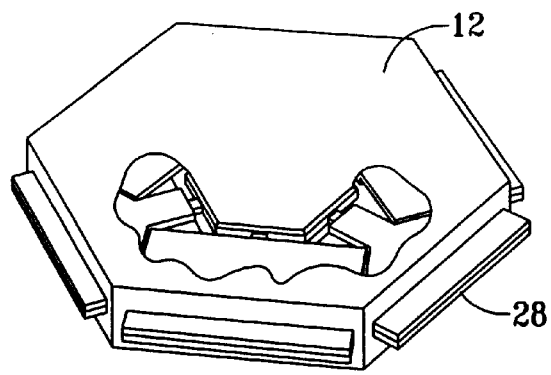
FIG. 34 is a perspective view, partially broken away, of hybrid-geometry resource cartridges inserted into a chassis according to an embodiment of the present invention.
Figure 35:
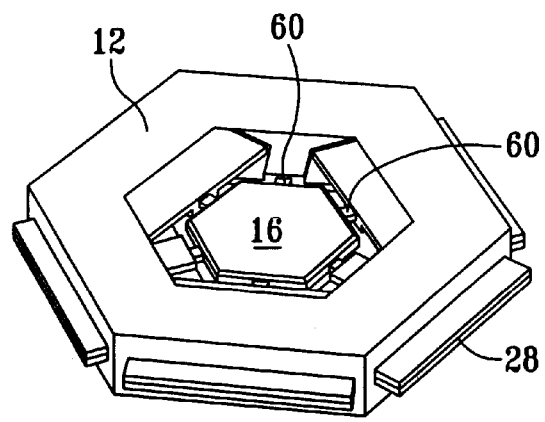
FIG. 35 is a perspective view of hybrid-geometry resource cartridges and a data transport unit inserted into a chassis according to an embodiment of the present invention.

Hybrid-geometry resource cartridges 28 according to embodiments of the present invention are applicable to modular electronics clusters comprised of: (1) cartridges 28 connected to data transport units 16, as illustrated in FIG. 32, (2) cartridges 28 insertable into a chassis 12, as illustrated in FIG. 34, or (3) data transport units 16 and cartridges 28 insertable into a chassis 12, as illustrated in FIG. 35.

Figure 36:
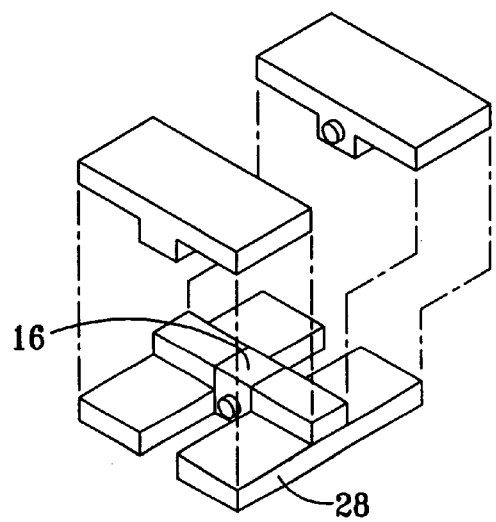
FIG. 36 is a perspective view of rectangular-shaped hybrid-geometry resource cartridges connectable to a data transport unit without a chassis according to an embodiment of the present invention.

Another alternative embodiment of the present invention is illustrated in FIG. 36, where the hybrid-geometry resource cartridges 28 are rectangular-shaped and connect to a data transport unit 16 without a chassis.

Referring again to FIG. 32, when hybrid-geometry resource cartridges 28 are arranged in alternating orientations and connected to a central data transport unit 16, it should be understood that the electrical connections may also be in alternating orientations, depending on the location of the lateral transport connectors 60 on the hybrid-geometry resource cartridges 28. In preferred embodiments of the present invention illustrated in FIG. 37, the lateral transport connector 60 on hybrid-geometry resource cartridge 28 is offset from the vertical centerline of the cartridge and is positioned at a point marked 60*a* in FIG. 30. This offset connector location requires that data transport unit 16 have two lateral transport connector placements; an upper placement (see reference character 62) and a lower placement (see reference character 64). With two placements, a hybrid-geometry resource cartridge 28 must be coupled to a data transport unit 16 in an orientation dictated by the location of the lateral transport connector 60.

Figure 38:
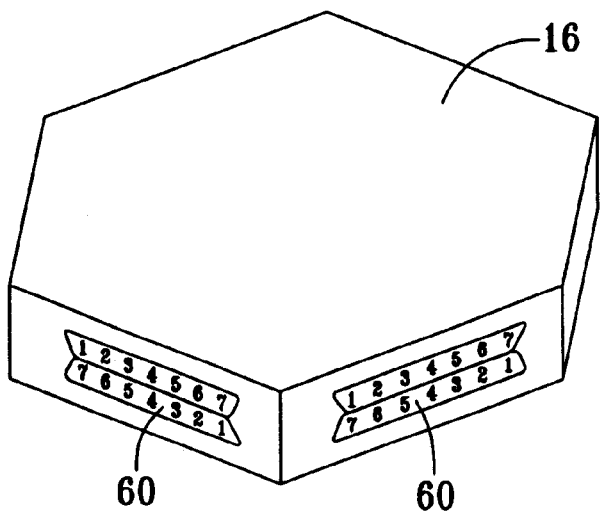
FIG. 38 is a perspective view of lateral transport connectors on a data transport unit designed with two sets of duplicated pins, each set of pins being rotated 180 degrees from the other set according to an embodiment of the present invention.

In alternative embodiments of the present invention, the lateral transport connector on hybrid-geometry resource cartridge is again offset, but, as illustrated symbolically in FIG. 38, a single lateral transport connector 60 on data transport unit 16 may be designed with two sets of duplicated pins, each set of pins being rotated 180 degrees from the other set. Each pair of duplicated pins in each lateral transport connector 60 is internally connected within data transport unit 16, such that a hybrid-geometry resource cartridge may be inserted in either orientation and still make proper connection with one of the sets of connector pins. This arrangement makes the orientation of a hybrid-geometry resource cartridge independent of its position around data transport unit 16. However, after the first hybrid-geometry resource cartridge is coupled to data transport unit 16, the required orientation of all other hybrid-geometry resource cartridges becomes fixed.

In further alternative embodiments of the present invention, the lateral transport connector on hybrid-geometry resource cartridge is not offset, but is located on the vertical centerline of the cartridge. This connector location requires that lateral transport connectors 60 on data transport unit 16 have one placement, but two pin orientations, as illustrated symbolically in FIG. 39. With two orientations, a hybrid-geometry resource cartridge must be coupled to a data transport unit in an orientation dictated by the lateral transport connector. Trapezoidal connector collars may be used to facilitate proper orientation.

In still further alternative embodiments, the lateral transport connectors may be perfectly symmetrical to allow a hybrid-geometry resource cartridge in either orientation to plug into the connector. In such an embodiment, a reversal switch, bi-directional multiplexer, or the like located internal to either the hybrid-geometry resource cartridge or the chassis may be employed to ensure proper connectivity.

Figure 37:
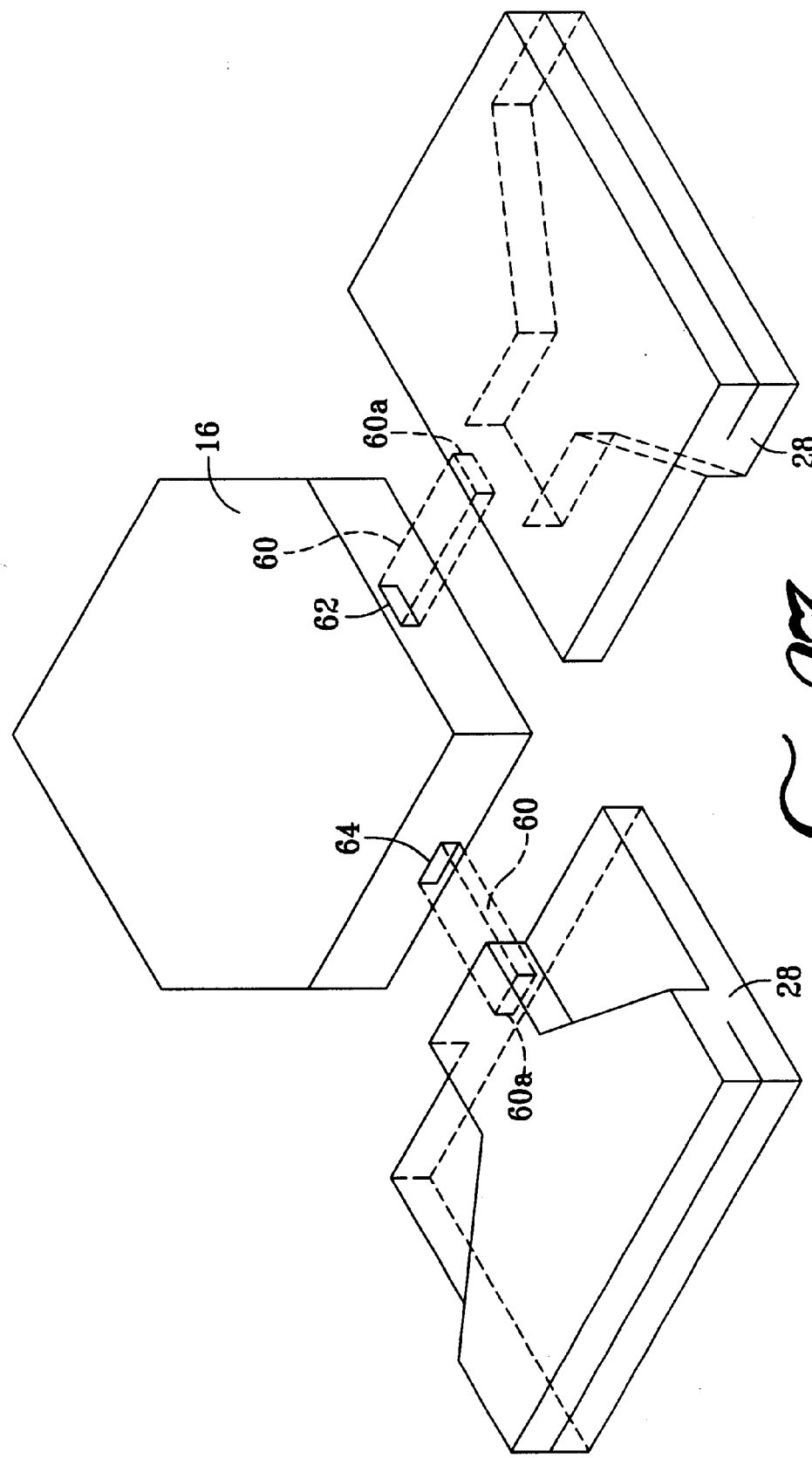
FIG. 37 is a perspective view of offset lateral transport connectors on hybrid-geometry resource cartridges and a data transport unit according to an embodiment of the present invention.
Figure 39:
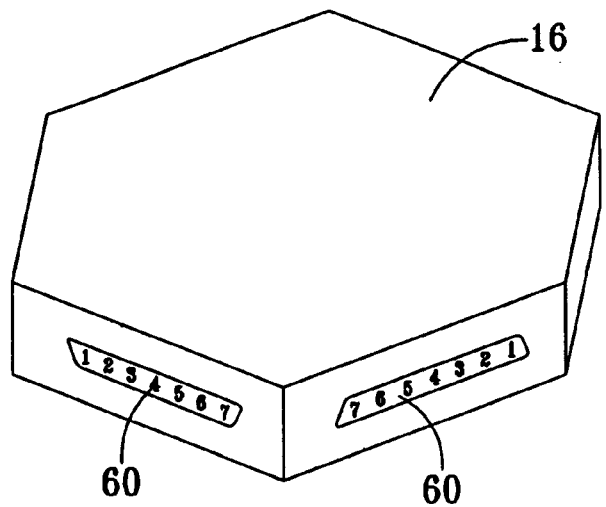
FIG. 39 is a perspective view of lateral transport connectors on a data transport unit having one placement, but two pin orientations, according to an embodiment of the present invention.
Figure 40:
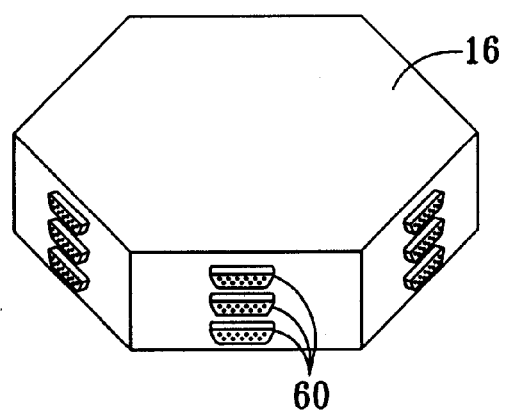
FIG. 40 is a perspective view of multiple lateral transport connectors located in Ace a vertical arrangement on each side of a data transport unit according to an embodiment of the present invention.

It should be understood that although FIGS. 37–39 illustrate one lateral transport connector per data transport unit side, in alternative embodiments of the present invention previously discussed, multiple hybrid-geometry resource cartridges may be plugged into a single slot, and therefore in alternative embodiments multiple lateral transport connectors 60 may be located in a vertical arrangement on each side of the data transport unit 16, as shown in FIG. 40.

Figure 41:
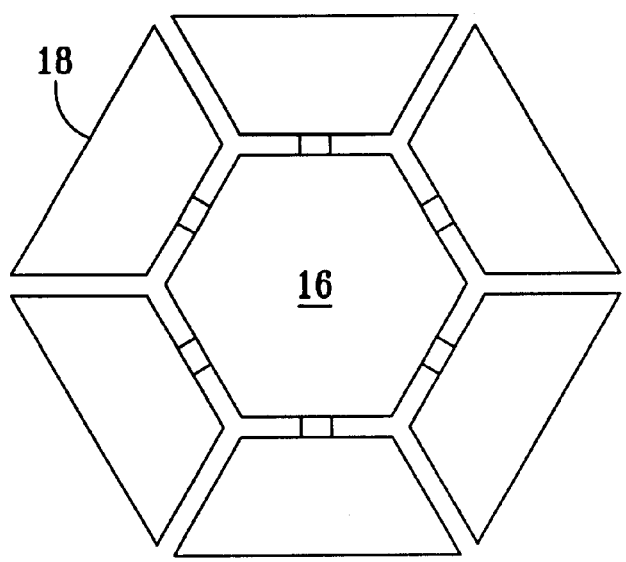
FIG. 41 is a top view of multi-sided resource cartridges designed using only adapter geometries and coupled to a data transport unit according to an embodiment of the present invention.

One advantage of hybrid-geometry resource cartridges is that the source geometry volume can be designed to initially contain existing, off-the shelf products, while providing a migration path to maximum potential by allowing for cartridges with off-the-shelf components to be replaced by next-generation cartridges containing state-of-the art components designed specifically to fit the entire volume of the cartridge. However, if existing, off-the-shelf components are not envisioned for use, which eliminates the constraint of adapting to a particular source geometry, in alternative embodiments of the present invention, multi-sided resource cartridges may be designed using only adapter geometries. As illustrated in the top view of FIG. 41, such multi-sided resource cartridges 18 are not constrained by existing products such as rectangular circuit boards, for example, but may be designed using components such as proprietary silicon and photonic switching elements arranged to fit the multi-sided shape. As illustrated in the example of FIG. 41, multi-sided resource cartridges 18 are coupled to a hexagonal data transport unit 16, and shaped to achieve maximum volume with minimal overall compactness. In such embodiments, the alternating orientations of the previously discussed adjacent hybrid-geometry resource cartridges may not be necessary. Such cartridges would not overlap but would simply slide into the chassis adjacent to each other. It should also be noted that multi-sided resource cartridges with one or more curved sides also fall within the scope of the present invention.

Centralized Multi-Sided Volumetric Data Transport Unit

In embodiments of the present invention described above, modular electronics clusters 10 are scalable when arranged and connected in an organized manner that allows them to fill three dimensional space, as illustrated in the example of FIG. 11. The scalability achievable by embodiments of the present invention is made possible by connecting all modular electronics clusters, and all resources within each modular electronics cluster, through a homogeneous topology heterogeneous (variant) protocol.

This homogeneous topology heterogeneous (variant) protocol is distributed across all modular electronics clusters in a system. As described above, in embodiments of the present invention, modular electronics clusters may include a centralized data transport unit. An example of such a data transport unit 16 is illustrated in FIG. 6. Although data transport unit 16 in FIG. 6 is hexagonal-shaped, embodiments of the present invention include any multi-sided data transport unit 16. The centralized location of the data transport unit in preferred embodiments of the present invention allows modular electronics clusters to be located around the data transport unit, thereby taking advantage of the compactness afforded by circles, or objects that approach a circular shape.

Electrical connectivity between adjacent modular electronics clusters 10 is achieved through data transport units 16, which contain the homogeneous topology heterogeneous (variant) protocol. In alternative embodiments, the electronic hardware necessary to implement this communication network may be located in the chassis or in the resource cartridges. When multiple modular electronics clusters are connected together, the interconnected homogeneous topology heterogeneous (variant) protocol forms an integrated network for enabling communication between resource cartridges within the same chassis or in different chassis. Examples of similar systems known in the art include telephone switching networks, Ethernet routers, and repeaters.

In preferred embodiments of the present invention, electrical connectivity between adjacent resources 14 is achieved through vertical transport channels 18 and lateral transport channels 24, illustrated symbolically in FIG. 17. Vertical transport channels 18 allow a resource 14 to be connected to vertically adjacent resources, while lateral transport channels 24 allow a resource 14 to be connected to laterally adjacent resources. As previously described, FIG. 24 illustrates another type of lateral transport channel 92 which is used to connect resources in adjacent vertical stacks. In preferred embodiments, vertical transport channels 18 and lateral transport channels 24 and 92 are propagated through data transport unit 16. However, in alternative embodiments the bridge circuitry 86 used to provide the homogeneous topology heterogeneous (variant) protocol may be located either in the data transport unit 16, chassis 12, or resource cartridge 14.

Figure 42:
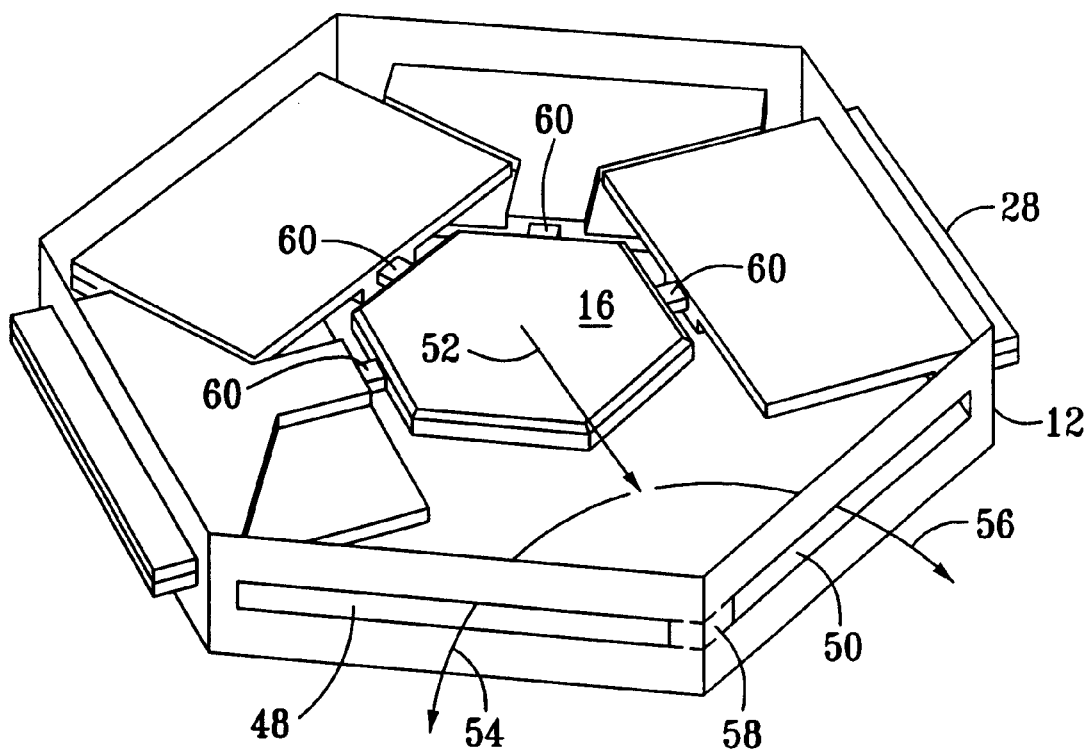
FIG. 42 is a perspective view of hybrid-geometry resource cartridges coupled to a hexagonal data transport unit within a chassis, with the top of chassis removed for clarity, illustrating how a data transport unit can be removed through cartridge openings according to an embodiment of the present invention.

In embodiments of the present invention, data transport unit 16 may be insertable into, or removable from, chassis 12 through openings in the top, bottom, or sides (cartridge openings) of chassis 12. FIG. 42, which illustrates an example embodiment of hybrid-geometry resource cartridges 28 coupled to a hexagonal data transport unit 16 with the top of chassis 12 removed for clarity, is useful to describe the removal of a data transport unit 16 from the cartridge openings. As FIG. 42 illustrates, by removing two adjacent hybrid-geometry resource cartridges, data transport unit 16 can be slid out first in the direction indicated by arrow 52, and then in the direction indicated either by arrows 54 or 56, until it can be removed from cartridge openings 48 or 50. In alternative embodiments, a portion of the chassis (indicated by dotted lines and reference character 58) may be removable to allow data transport unit 16 to be removed in the direction of arrow 52 only.

To facilitate removal of data transport unit 16 in the direction of arrow 52 without first removing all hybrid-geometry resource cartridges 28, lateral transport connectors 60 may comprise, in preferred embodiments, contactless phototransistor/laser diode pairs, or the like. In alternative embodiments, lateral transport connectors 60 may be retractable in one or more dimensions to break all physical connections and ready the data transport unit 16 for removal. If the connectors are implemented with simple pin and socket arrangements, each cartridge 28 needs to be removed slightly from the chassis so as to disconnect the pins from their respective sockets, and then the data transport unit 16 can be removed as indicated above.

Figure 43:
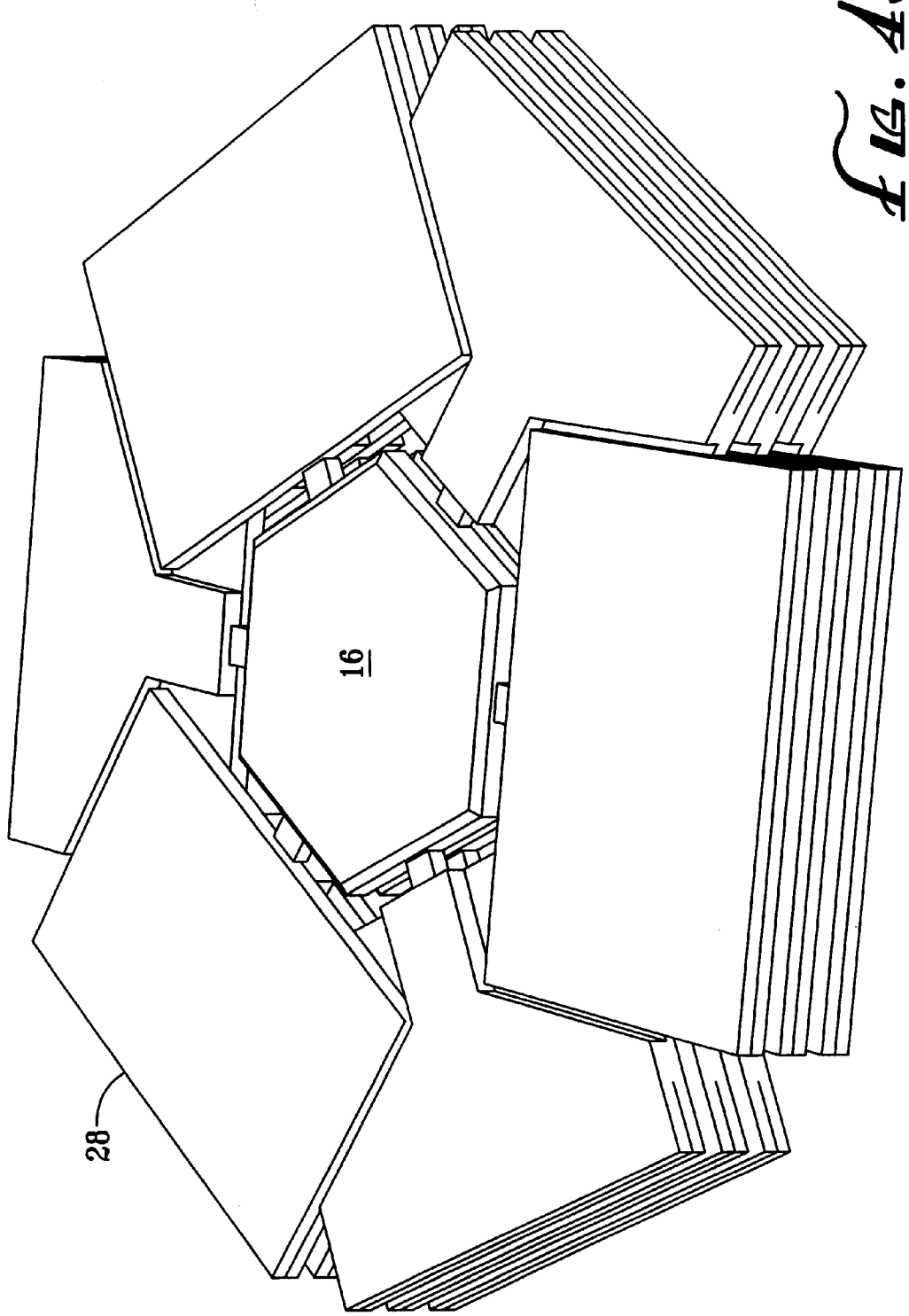
FIG. 43, is a perspective view of a vertical stack of three modular electronics clusters, shown without a chassis for clarity, illustrating that if the data transport unit on the bottom or middle modular electronics cluster needs to be replaced, side removal according to an embodiment of the present invention will allow the data transport unit to be swapped out without having to remove the uppermost modular electronics clusters.

The advantage of side removal of data transport units can be understood with reference to FIG. 43 which illustrates an example embodiment of a vertical stack of three modular electronics clusters, each modular electronics cluster comprised of six hybrid-geometry resource cartridges 28 coupled to a hexagonal data transport unit 16 with the chassis removed for clarity. If the data transport unit 16 on the bottom or middle modular electronics cluster needs to be replaced, side removal will allow the data transport unit 16 to be swapped out without having to remove the uppermost modular electronics clusters.

Hexagonal Chassis For Housing and Volumetric Cascading of Electronics

As described above, a number of embodiments of the present invention can be preferably implemented in a hexagonal shape. For example, FIG. 1 illustrates a modular electronics cluster 10 comprising a hexagonal chassis 12, FIG. 32 illustrates six hybrid-geometry resource cartridges 28 connected to a hexagonal data transport unit 16, FIG. 12 illustrates a hexagonal resource cartridge 14, and FIG. 21 illustrates hexagonal floor modules 22.

Alex Thue, a Norwegian mathematician, has proven that hexagonal packing provides the greatest density in a two-dimensional plane. This proof is described in an article entitled "Cannonballs and Honeycombs" by Thomas C. Hales, Notice of the AMS, April 2000, Volume 47, Number 4, at p. 442. The efficiency of the hexagonal shape is demonstrated in spatial economic theory and is related to the maximum compactness of circles. For example, when implementing digital processing algorithms on two-dimensional images, if the pixels are arranged in hexagonal form, there is a 33% increase in the processing efficiency as opposed to rectangular pixels. This efficiency increase is due to the fact that hexagonal shapes can be arranged in a more compact array, and therefore it takes fewer pixels to implement the processing algorithms. Because hexagonal shapes can be arranged in a more compact array than other shapes, hexagonal implementations of embodiments of the present invention can produce increased packaging efficiency, shorter signal routing, and less signal degradation.

What is claimed is:

1. A compact electronic system comprising:
   a receptacle for routing signals, said receptacle having a plurality of side-receiving portions in different planes from one another and a centrally located data transport unit; and
   a plurality of resource cartridges for performing electronic functions, each resource cartridge removably insertable into one of side receiving portions of said receptacle;
   said data transport unit having a receiving port for each of said plurality of cartridges for electronically connecting to said inserted resource cartridge to provide lateral transport channels thereto, and said data transport unit providing communication pathways from at least one receiving port to at least one other receiving port.

2. A compact electronic system as recited in claim 1, wherein any resource cartridge is insertable into any side receiving portion.

3. A compact electronic system as recited in claim 1, wherein said receptacle includes communication pathways from each receiving port to every other receiving port.

4. A compact electronic system as recited in claim 1, wherein said plurality of side receiving portions are arranged in a polygonal shape.

5. A compact electronic system as recited in claim 1, wherein said plurality of side receiving portions are arranged in a hexagonal shape.

6. A compact electronic system as recited in claim 1, wherein said communication pathways for electronically connecting said inserted resource cartridge includes an optical receiver for receiving data and converting said data into electronic signals.

7. A scalable electronic system comprised of a plurality of modular electronics clusters, each modular electronics cluster comprising:
   a receptacle for routing signals, the receptacle including one or more transport channels; and
   a plurality of resource cartridges for performing electronic functions, each resource cartridge removably connectable to the receptacle for enabling communication between the plurality of resource cartridges through the receptacle by physically positioning the resource cartridges adjacent to the receptacle;
   wherein each modular electronics cluster is connectable to other modular electronics clusters to enable communication therebetween, by aligning one or more transport channels on each modular electronics cluster; and
   the receptacle comprises a data transport unit having a plurality of lateral transport channels for enabling communication between the plurality of resource cartridges physically positioned adjacent to the data transport unit.

8. A scalable electronic system as recited in claim 7, the receptacle including hardware for propagating signals through the receptacle, and to or from the receptacles of other modular electronics clusters.

9. A scalable electronic system as recited in claim 8, the hardware comprising vertical transport channels;
   wherein each modular electronics cluster is connectable to other modular electronics clusters by stacking the modular electronics clusters and aligning the vertical transport channels on the modular electronics clusters.

10. A scalable electronic system as recited in claim 7, the receptacle comprising a chassis having openings for receiving the resource cartridges.

11. A scalable electronic system comprised of a plurality of modular electronics clusters, each modular electronics cluster comprising:
   a chassis for routing signals, the chassis including one or more transport channels; and
   a plurality of resource cartridges for performing electronic functions, each resource cartridge removably connectable to the chassis for enabling communication between the plurality of resource cartridges through the chassis by physically positioning the resource cartridges adjacent to the chassis;
   wherein each modular electronics cluster is connectable to other modular electronics clusters to enable communication therebetween, by connecting one or more transport channels on each modular electronics cluster; and
   wherein the chassis comprises a data transport unit having a plurality of lateral transport channels for enabling communication between the plurality of resource cartridges physically positioned adjacent to the data transport unit.

12. A scalable electronic system as recited in claim 11, the chassis further including a homogeneous topology heterogeneous (variant) protocol for propagating signals through the chassis, and to or from the chassis of other modular electronics clusters;
   wherein when a plurality of modular electronics clusters are connected, the homogeneous topology heterogeneous (variant) protocol forms an integrated network for enabling communication between resource cartridges within the same chassis or in different chassis.

13. A scalable electronic system comprised of a plurality of modular electronics clusters, each modular electronics cluster comprising:
   a chassis;
   a plurality of resource cartridges receivable by the chassis for performing electronic functions, each resource cartridge removably connectable to the chassis for enabling communication between the plurality of resource cartridges through the chassis by physically positioning the resource cartridges adjacent to the chassis; and
   a data transport unit receivable by the chassis for routing signals, the data transport unit removably connectable to the chassis for enabling communication between the plurality of resource cartridges through the chassis and the data transport unit by physically positioning the data transport unit adjacent to the chassis, and including one or more transport channels;
   wherein each modular electronics cluster is connectable to other modular electronics clusters to enable communication therebetween, by aligning one or more transport channels on each modular electronics cluster.

14. A scalable electronic system as recited in claim 13, the data transport unit further including hardware for propagating signals through the modular electronics cluster, and to or from other modular electronics clusters.

15. A scalable electronic system as recited in claim 14, the one or more transport channels comprising vertical transport channels;
   wherein each modular electronics cluster is connectable to other modular electronics clusters by stacking the modular electronics clusters and aligning the vertical transport channels on each modular electronics cluster.

16. A scalable electronic system comprised of a plurality of modular resource cartridges, each modular resource cartridge comprising:
   a plurality of resources for performing electronic functions;
   one or more transport channels connected to the plurality of resources for enabling communication between other modular resource cartridges; and
   homogeneous topology heterogeneous (variant) protocol hardware for enabling communication between the plurality of resources within the modular resource cartridge and between other modular resource cartridges;
   wherein each modular resource cartridge is connectable to other modular resource cartridges to enable communication therebetween, by aligning one or more transport channels on each modular resource cartridge;
   the one or more transport channels comprising vertical transport channels;
   wherein each modular resource cartridge is connectable to other modular resource cartridges by stacking the modular resource cartridges and aligning the vertical transport channels on the modular resource cartridges;
   each modular resource cartridge further including one or more lateral transport channels connected to the plurality of resources for enabling communication between other modular resource cartridges:
   wherein each modular resource cartridge is connectable to other modular resource cartridges by laterally arranging the modular resource cartridges and aligning the lateral transport channels on the modular resource cartridges;
   further including a base module for supporting one or more stacks of resource cartridges, the base module including one or more vertical transport channels and a homogeneous topology heterogeneous (variant) protocol for enabling communication between modular resource cartridges through the base module;
   wherein each stack of modular resource cartridges is connectable to the base module by supporting the stack of modular resource cartridges on the base module and aligning one or more vertical transport channels on the stack of modular resource cartridges and the base module;
   the base module including one or more vertical extensions having one or more lateral transport channels;
   wherein a plurality of stacks of modular resource cartridges are connectable by laterally arranging the plurality of stacks of modular resource cartridges, and aligning the lateral transport channels on the plurality of stacks of modular resource cartridges and the lateral transport channels on the vertical extensions.

17. A method for producing scalable electronic systems, the method comprising the steps of:
   forming a plurality of modular electronics clusters, the step of forming each modular electronics cluster comprising the steps of
      housing resources for performing electronic functions in a plurality of resource cartridges, and physically positioning the plurality of resource cartridges adjacent to a receptacle for enabling communication between the plurality of resource cartridges through the receptacle, the plurality of resource cartridges removably connectable to the receptacle, each receptacle including one or more transport channels;

connecting the plurality of modular electronics clusters to enable communication therebetween, by aligning one or more transport channels on each modular electronics cluster; and forming a data transport unit within said receptacle, said data transport unit having a plurality of lateral transport channels for enabling communication between the plurality of resource cartridges physically positioned adjacent to the data transport unit.

18. A method for producing scalable electronic systems as recited in claim 17, further including the step of propagating signals through the receptacle, and to or from the receptacles of other modular electronics clusters, using hardware within the receptacle.

19. A method for producing scalable electronic systems as recited in claim 18:

the step of propagating signals to or from the receptacles of other modular electronics clusters comprising propagating signals through vertical transport channels; and the step of aligning one or more transport channels on each modular electronics cluster comprising stacking the modular electronics clusters and aligning the vertical transport channels on the modular electronics clusters.

20. A method for producing scalable electronic systems as recited in claim 17, the step of physically positioning the plurality of resource cartridges adjacent to a receptacle comprising inserting the plurality of resource cartridges into one or more openings in the receptacle.

21. A method for producing scalable electronic systems, the method comprising the steps of:

forming a plurality of modular electronics clusters, the step of forming each modular electronics cluster comprising the steps of housing resources for performing electronic functions in a plurality of resource cartridges, and physically positioning the plurality of resource cartridges adjacent to a chassis for enabling communication between the plurality of resource cartridges through the chassis, the plurality of resource cartridges removably connectable to the chassis, each chassis including one or more transport channels; and connecting the plurality of modular electronics clusters to enable communication therebetween, by connecting one or more transport channels on each modular electronics cluster; and forming a data transport unit within said chassis, said data transport unit having a plurality of lateral transport channels for enabling communication between the plurality of resource cartridges physically positioned adjacent to the data transport unit.

22. A method for producing a scalable electronic system as recited in claim 21, further including the step of propagating signals through the chassis of each modular electronics cluster, and to or from the chassis of other modular electronics clusters, using a homogeneous topology heterogeneous (variant) protocol;

wherein when a plurality of modular electronics clusters are connected, the homogeneous topology heterogeneous (variant) protocol forms an integrated network for enabling communication between resource cartridges within the same chassis or in different chassis.

23. A method for producing scalable electronic systems, the method comprising the steps of:

forming a plurality of modular electronics clusters, the step of forming each modular electronics cluster comprising the steps of housing resources for performing electronic functions in at least one resource cartridge, and housing hardware for propagating signals in a data transport unit, and physically positioning the plurality of resource cartridges and the data transport unit adjacent to a receptacle for enabling communication between the plurality of resource cartridges through the receptacle and the data transport unit, the plurality of resource cartridges and data transport unit removably connectable to the receptacle, each data transport unit including one or more transport channels;

connecting the plurality of modular electronics clusters to enable communication therebetween, by aligning one or more transport channels on each modular electronics cluster; and providing said data transport unit with lateral transport channels for enabling communication between the plurality of resource cartridges physically positioned adjacent to the data transport unit.

24. A method for producing scalable electronic systems as recited in claim 23, further including the step of propagating signals through each modular electronics cluster, and to or from other modular electronics clusters, using hardware within the data transport unit.

25. A method for producing scalable electronic systems as recited in claim 24:

the step of propagating signals to or from other modular electronics clusters comprising propagating signals through vertical transport channels; and the step of aligning one or more transport channels on each modular electronics cluster comprising stacking the modular electronics clusters and aligning the vertical transport channels on each modular electronics cluster.

26. A method for producing scalable electronic systems, the method comprising the steps of:

forming a plurality of modular resource cartridges, the step of forming each modular resource cartridge comprising the steps of housing a plurality of resources for performing electronic functions in each modular resource cartridge, each modular resource cartridge including one or more transport channels, and housing a homogeneous topology heterogeneous (variant) protocol for enabling communication between the plurality of resources within the modular resource cartridge and between other modular resource cartridges; and connecting a first plurality of modular resource cartridges to enable communication therebetween, by aligning one or more transport channels on each modular resource cartridge;

further including the step of communicating between modular resource cartridges by propagating signals generated by the homogeneous topology heterogeneous (variant) protocol through vertical transport channels; and the step of aligning one or more transport channels on each modular resource cartridge comprising stacking the modular resource cartridges and aligning the vertical transport channels on each modular electronics cluster;

the step of forming each modular resource cartridge further including the step of connecting the plurality of resources to one or more lateral transport channels for enabling communication between other modular resource cartridges, the method further including the step of:

connecting a second plurality of modular resource cartridges by laterally arranging the second plurality of resource cartridges and aligning the lateral transport channels on the modular resource cartridges;

supporting one or more stacks of modular resource cartridges on a base module, the base module including one or more vertical transport channels and the homogeneous topology heterogeneous (variant) protocol for enabling communication between modular resource cartridges through the base module; and connecting each stack of modular resource cartridges to the base module by aligning one or more vertical transport channels on the stack of modular resource cartridges and the base module;

laterally supporting and providing connectivity for a plurality of stacks of modular resource cartridges on the base module using one or more vertical extensions from the base module having a plurality of lateral transport channels; and connecting the plurality of vertical stacks of modular resource cartridges by laterally arranging the plurality of stacks of modular resource cartridges, and aligning the lateral transport channels on the plurality of stacks of modular resource cartridges and the lateral transport channels on the vertical extensions.

* * * * *